(12) United States Patent
Tang et al.

(10) Patent No.: US 10,825,815 B2
(45) Date of Patent: Nov. 3, 2020

(54) MEMORY ARRAYS

(71) Applicant: Micron Technology, Inc., Boise, ID (US)

(72) Inventors: Sanh D. Tang, Kuna, ID (US); Martin C. Roberts, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/973,707

(22) Filed: May 8, 2018

(65) Prior Publication Data

US 2018/0323200 A1      Nov. 8, 2018

Related U.S. Application Data

(60) Provisional application No. 62/503,018, filed on May 8, 2017.

(51) Int. Cl.
*H01L 27/108* (2006.01)
*H01L 29/423* (2006.01)
(Continued)

(52) U.S. Cl.
CPC ...... *H01L 27/10805* (2013.01); *H01L 23/528* (2013.01); *H01L 27/0688* (2013.01); *H01L 27/1085* (2013.01); *H01L 27/10852* (2013.01); *H01L 27/10858* (2013.01); *H01L 27/10873* (2013.01); *H01L 27/10882* (2013.01); *H01L 27/11507* (2013.01); *H01L 28/60* (2013.01); *H01L 28/86* (2013.01); *H01L 29/0847* (2013.01); *H01L 29/1033* (2013.01); *H01L 29/4236* (2013.01); *H01L 29/42376* (2013.01); *H01L 29/7827* (2013.01); *H01L 21/0217* (2013.01); *H01L 21/02164* (2013.01); *H01L 21/02532* (2013.01); *H01L 21/02595* (2013.01);
(Continued)

(58) Field of Classification Search
CPC combination set(s) only.
See application file for complete search history.

(56) References Cited

U.S. PATENT DOCUMENTS 5,915,167 A    6/1999    Leedy
5,977,580 A    11/1999   Yoon
(Continued)

FOREIGN PATENT DOCUMENTS

EP    2276035      1/2011
EP    18798954     4/2020
(Continued)

OTHER PUBLICATIONS

Matsubayashi et al., "20-nm-node trench-gate-self-aligned crystalline in-Ga—Zn-Oxide FET with high frequency and low off-state current", IEEE International Electron Devices Meeting (IEDM), Dec. 7-9, 2015, United States, 4 pages.
(Continued)

*Primary Examiner* — Ratisha Mehta
(74) *Attorney, Agent, or Firm* — Wells St. John P.S.

(57) ABSTRACT

A memory array comprises vertically-alternating tiers of insulative material and memory cells. The memory cells individually comprise a transistor and a capacitor. One of (a) a channel region of e transistor, or (b) a pair of electrodes of the capacitor, is directly above the other of (a) and (b). Additional embodiments and aspects are disclosed.

27 Claims, 30 Drawing Sheets

(51) Int. Cl.
*H01L 29/08* (2006.01)
*H01L 29/10* (2006.01)
*H01L 23/528* (2006.01)
*H01L 27/11507* (2017.01)
*H01L 49/02* (2006.01)
*H01L 27/06* (2006.01)
*H01L 29/78* (2006.01)
*H01L 21/265* (2006.01)
*H01L 27/11514* (2017.01)
*H01L 21/311* (2006.01)
*H01L 21/02* (2006.01)
*H01L 21/28* (2006.01)
*H01L 21/3213* (2006.01)
*H01L 21/306* (2006.01)
*H01L 27/11597* (2017.01)

(52) U.S. Cl.
CPC .. *H01L 21/26513* (2013.01); *H01L 21/28088* (2013.01); *H01L 21/30604* (2013.01); *H01L 21/31111* (2013.01); *H01L 21/32133* (2013.01); *H01L 27/11514* (2013.01); *H01L 27/11597* (2013.01)

(56) References Cited

U.S. PATENT DOCUMENTS

| | | | |
|---|---|---|---|
| 6,160,284 | A | 12/2000 | Hachisuka et al. |
| 8,546,955 | B1 | 10/2013 | Wu |
| 9,230,985 | B1 | 1/2016 | Wu et al. |
| 9,698,272 | B1 * | 7/2017 | Ikeda ............... H01L 29/78606 |
| 2004/0232466 | A1 | 11/2004 | Birner et al. |
| 2005/0157583 | A1 | 7/2005 | Hofmann |
| 2007/0161277 | A1 | 7/2007 | Baars et al. |
| 2007/0236979 | A1 | 10/2007 | Takashima |
| 2010/0038743 | A1 | 2/2010 | Lee |
| 2011/0033955 | A1 | 2/2011 | Kang |
| 2011/0079836 | A1 | 4/2011 | Lin |
| 2012/0075917 | A1 | 3/2012 | Takemura |
| 2012/0228688 | A1 | 9/2012 | Matsubayashi |
| 2013/0037879 | A1 | 2/2013 | Filippini et al. |
| 2013/0069052 | A1 | 3/2013 | Sandhu |
| 2013/0161607 | A1 * | 6/2013 | Yoneda ............... H01L 27/0688 257/43 |
| 2013/0279276 | A1 | 10/2013 | Schaefer |
| 2014/0035018 | A1 | 2/2014 | Lee |
| 2014/0210026 | A1 | 7/2014 | Karlsson et al. |
| 2015/0048292 | A1 | 2/2015 | Park |
| 2016/0049406 | A1 | 2/2016 | Sandhu |
| 2016/0322368 | A1 | 11/2016 | Sun et al. |
| 2017/0018570 | A1 | 1/2017 | Lue et al. |
| 2017/0092371 | A1 | 3/2017 | Harari |
| 2018/0197864 | A1 | 7/2018 | Sills |
| 2018/0323200 | A1 | 11/2018 | Tang et al. |
| 2019/0027493 | A1 | 1/2019 | Kimura |
| 2019/0067206 | A1 | 2/2019 | Bedeschi et al. |
| 2019/0067288 | A1 | 2/2019 | Juengling |
| 2019/0198510 | A1 | 6/2019 | Kim |

FOREIGN PATENT DOCUMENTS

| | | |
|---|---|---|
| KR | 10-2012-0069258 | 6/2012 |
| WO | WO 2013/095676 | 6/2013 |
| WO | WO 2017/034647 | 3/2017 |
| WO | WO PCT/US2018/031500 | 8/2018 |
| WO | WO PCT/US2019/031500 | 11/2019 |

OTHER PUBLICATIONS

U.S. Appl. No. 15/973,697, filed May 8, 2018, by Roberts et al.
U.S. Appl. No. 16/204,224, filed Nov. 29, 2018 by Tang et al.
U.S. Appl. No. 16/192,462, filed Nov. 15, 2018 by Tang et al.

* cited by examiner

MEMORY ARRAYS

TECHNICAL FIELD

Embodiments disclosed herein pertain to memory arrays.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, or sense lines) and access lines (which may also be referred to as word lines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates, and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages, and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the hi-stable characteristics of the ferroelectric material that forms a part of the capacitor. Programmable materials other than ferroelectric materials may be used as a capacitor insulator to render capacitors non-volatile.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example reversibly programmable charge storage/trap regions as part of the gate construction between the gate insulator and the conductive gate.

One type of transistor is a ferroelectric field effect transistor (FeFET) wherein at least some portion of the gate construction (e.g., the gate insulator) comprises ferroelectric material. The two different polarized states of the ferroelectric material in field effect transistors may be characterized by different threshold voltage ($V_t$) for the transistor or by different channel conductivity for a selected operating voltage. Again, polarization state of the ferroelectric material can be changed by application of suitable programming voltages, and which results in one of high channel conductance or low channel conductance. The high and low conductance, invoked by the ferroelectric polarization state, remains after removal of the gate programming voltage (at least for a time). The status of the channel can be read by applying a small drain voltage which does not disturb the ferroelectric polarization. Programmable materials other than ferroelectric materials may be used as a gate insulator to render a transistor to be non-volatile.

DETAILED DESCRIPTION OF EXAMPLE EMBODIMENTS

Figure 1:
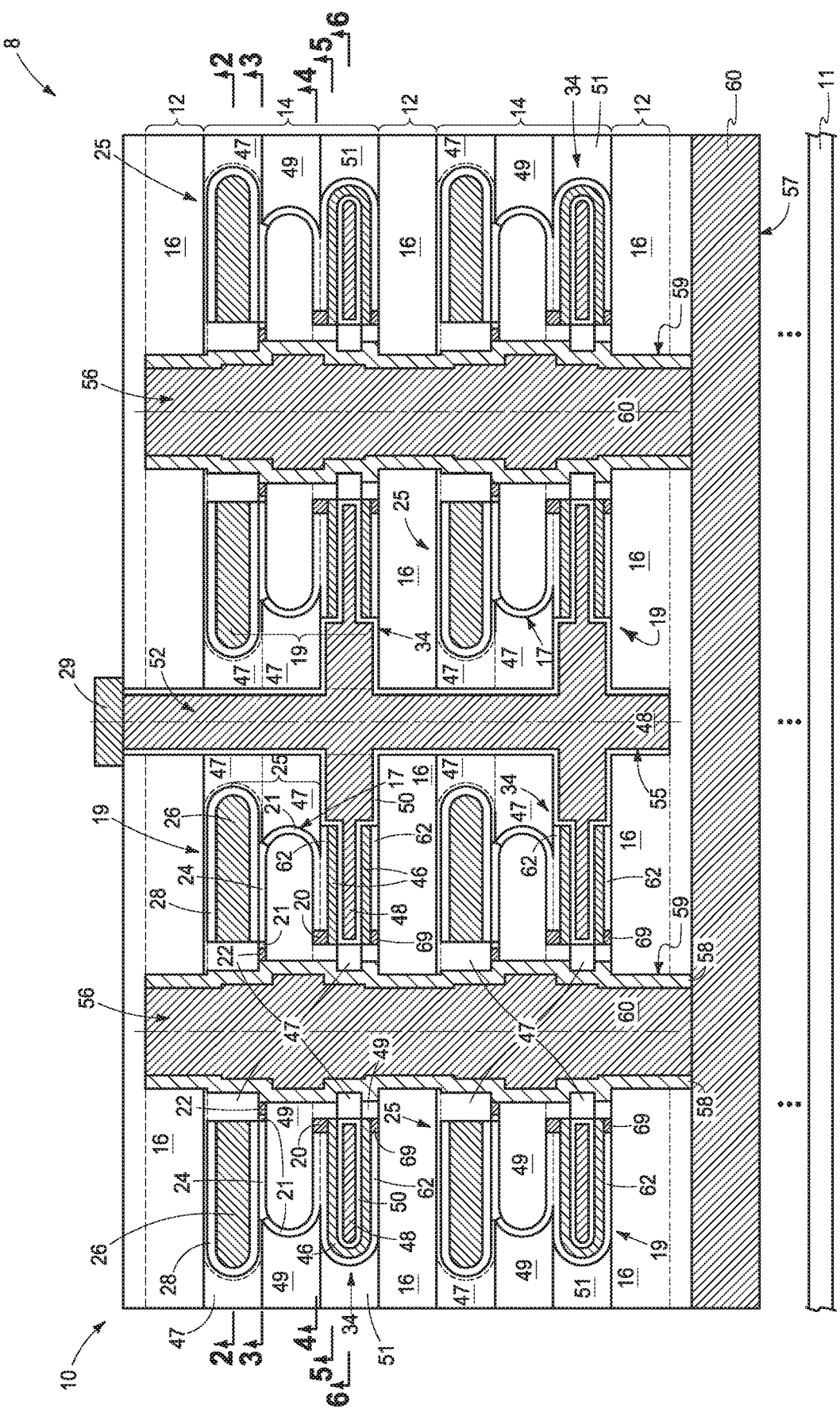
FIG. 1 is a diagrammatic sectional view of a substrate fragment comprising a memory array in accordance with an embodiment of the invention, and is taken through line 1-1 in FIGS. 2-6.

Embodiments of the invention encompass memory arrays. A first example embodiment is shown in and described with references to FIGS. 1-9. Such includes a substrate structure or construction 8 comprising a memory array 10 fabricated relative to a base substrate 11. Substrate 11 may comprise any one or more of conductive/conductor/conducting (i.e., electrically herein), semiconductive/semiconductor/semi-conducting, and insulative/insulator/insulating (i.e., electrically herein) materials. Various materials have been formed elevationally over base substrate 11. Materials may be aside, elevationally inward, or elevationally outward of the FIGS. 1-9—depicted materials. For example, other partially or wholly fabricated components of integrated circuitry may be provided somewhere above, about, or within base substrate 11. Control and/or other peripheral circuitry for operating components within a memory array may also be fabricated, and may or may not be wholly or partially within a memory array or sub-array. Further, multiple sub-arrays may also be fabricated and operated independently, in tandem, or otherwise relative one another. As used in this document, a "sub-array" may also be considered as an array.

Construction 8 includes vertically-alternating tiers 12 and 14 of insulative material 16 (e.g., comprising, consisting essentially of, or consisting of carbon-doped silicon nitride [2 to 10 atomic percent carbon], silicon nitride, and/or doped or undoped silicon dioxide deposited to a thickness of 200 Angstroms to 500 Angstroms) and memory cells 19, respectively. Memory cell tiers 14 may be of the same or different thickness as that of insulative material tiers 12, with different and greater thickness being shown (e.g., 500 Angstroms to 1,500 Angstroms). Construction 8 is shown as having five vertically-alternating tiers 12 and 14, although likely many more (e.g., dozens, hundreds, etc.) may be formed. Accordingly, more tiers 12 and 14 may be below the depicted tiers and above base substrate 11 and/or more tiers 12 and 14 may be above the depicted tiers.

Memory cells 19 individually comprise a transistor 25 and a capacitor 34. Transistor 25 comprises a first source/drain region 20 and a second source/drain region 22 (e.g., conductively-doped semiconductor material such as polysilicon for each) having a channel region 24 there-between (e.g., doped semiconductor material, such as poly silicon, but not to be intrinsically conductive). In some embodiments and as shown, electrically semiconductive regions 21 (e.g., LDD and/or halo regions) and/or conductively-doped semiconductive material regions 21 are between channel region 24 and one or both of source/drain regions 20 and 22.

A gate 26 (e.g., one or more of elemental metal, a mixture or alloy of two or more elementals, conductive metal compounds, and conductively-doped semiconductive materials) is operatively proximate channel region 24. Specifically, in the depicted example, a gate insulator material 28 (e.g., silicon dioxide, silicon nitride, hafnium oxide, other high k insulator material, and/or ferroelectric material) is between gate 26 and channel region 24. At least a portion of channel region 24 is horizontally-oriented for horizontal current flow in the portion between first source/drain region 20 and second source/drain region 22. In the depicted example embodiment, all of channel region 24 is horizontally-oriented for horizontal current flow there-through. Regardless, when suitable voltage is applied to gate 26, a conductive channel can form within channel region 24 proximate gate insulator material 28 such that current is capable of flowing between source/drain regions 20 and 22 (and through regions 21 when present).

Figure 7:
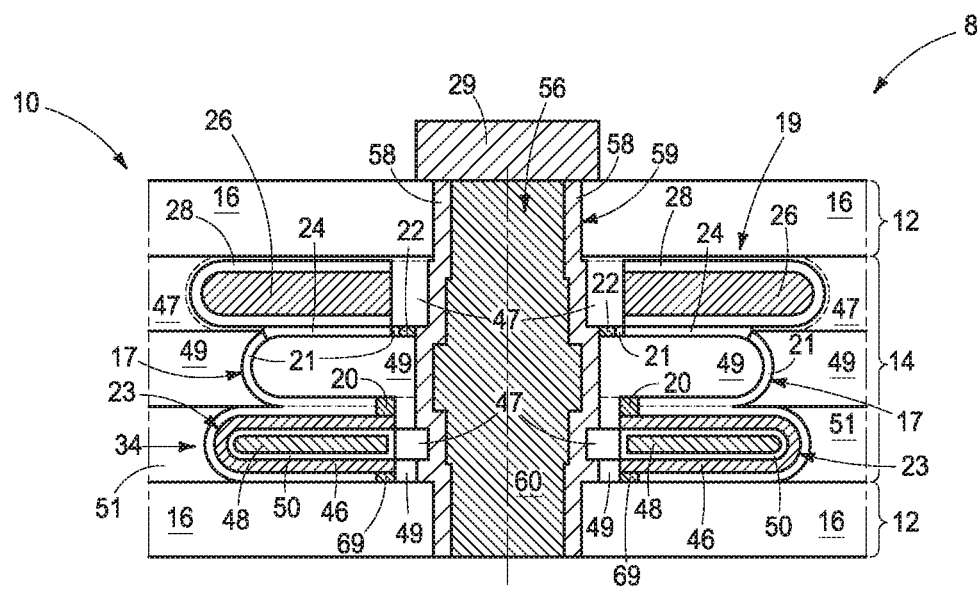
FIG. 7 is a sectional view taken through line 7-7 in FIGS. 2-6, and is at the same scale as FIG. 1.

In one embodiment and as shown, one (e.g., 22) of first source/drain region 20 and second source/drain region 22 is above the other. Regardless, in one embodiment and as shown, neither of first source/drain region 20 nor second source/drain region 22 is directly above the other. In one embodiment and as shown, first source/drain region 20, second source/drain region 22, and channel region 24 collectively comprise opposing C-like shapes 17 that face one another in a straight-line vertical cross-section (e.g., the cross-section shown by FIG. 7, with FIG. 1 not being a straight-line vertical cross-section as evidenced by the angled 1-1 section line segments in FIGS. 2-6; FIG. 7 only shows one memory cell tier 14 and two insulative material tiers 12). In one embodiment and as shown, first source/drain region 20 comprises an annulus 41 in a straight-line horizontal cross-section (e.g., the cross-section shown by FIG. 4). In one embodiment and as shown, second source/drain ref-Lion 22 comprises an annulus 42 in a straight-line horizontal cross-section (e.g., the cross-section shown by FIG. 3).

Figure 2:
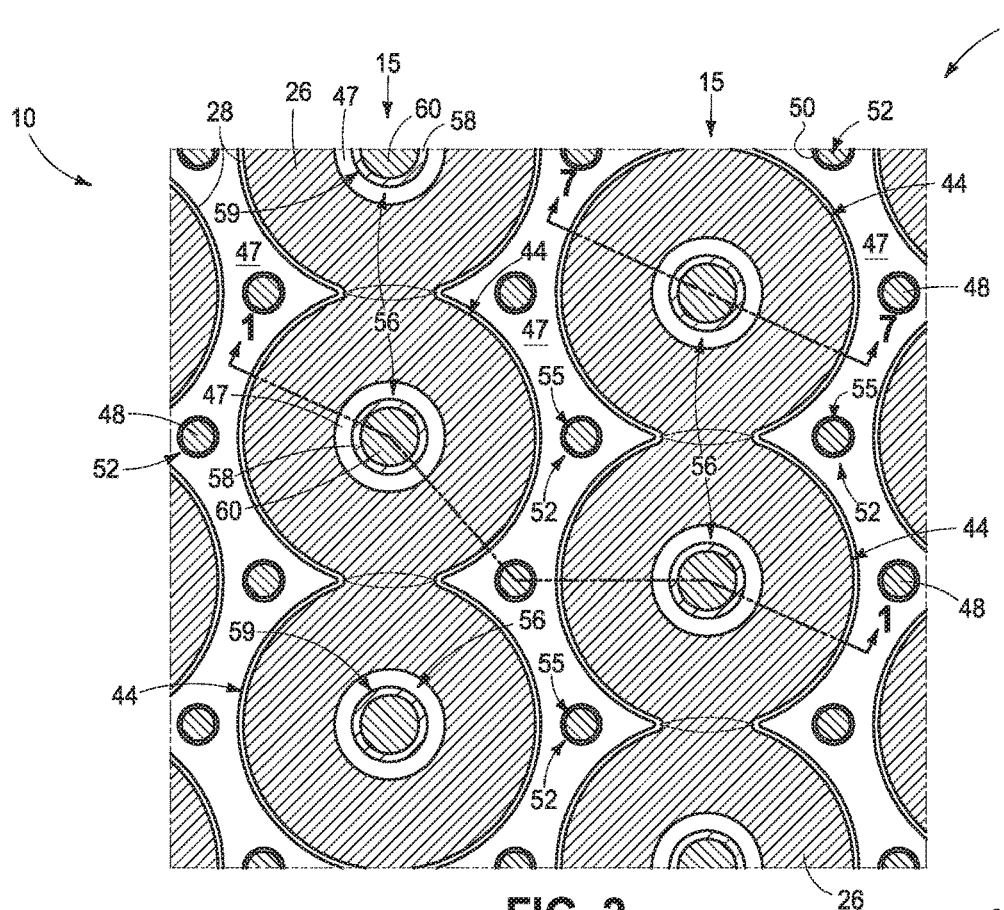
FIG. 2 is a sectional view taken through line 2-2 in FIG. 1, and at a smaller scale than FIG. 1.
Figure 3:
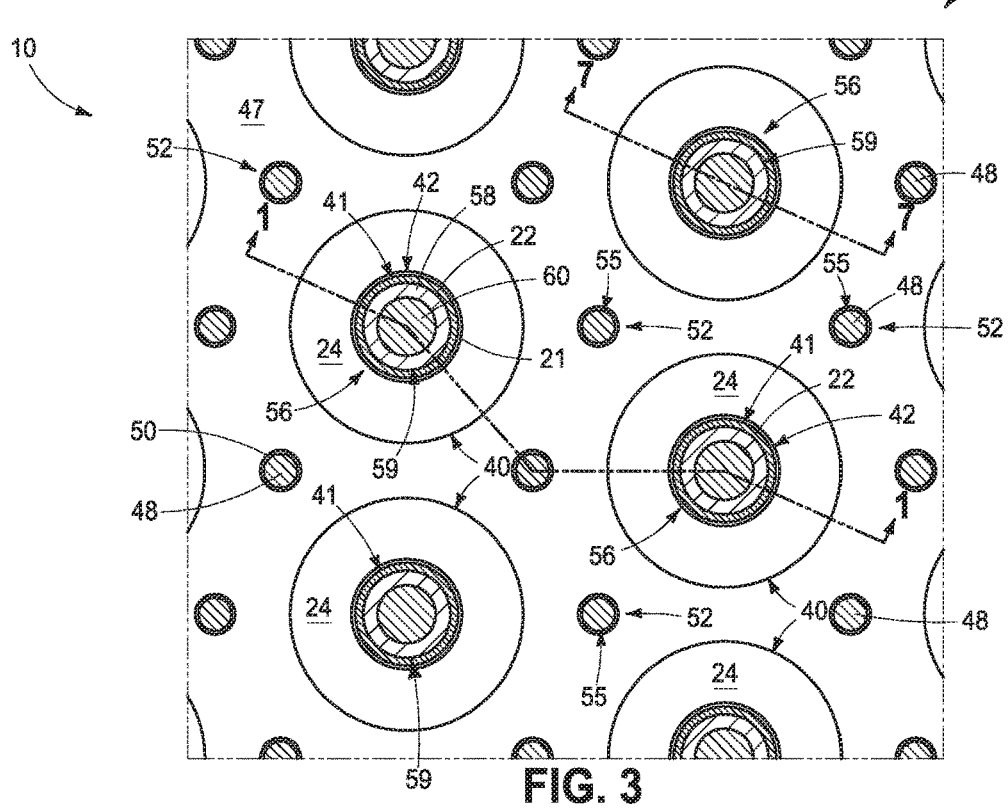
FIG. 3 is a sectional view taken through line 3-3 in FIG. 1, and is at the same smaller scale as FIG. 2.
Figure 4:
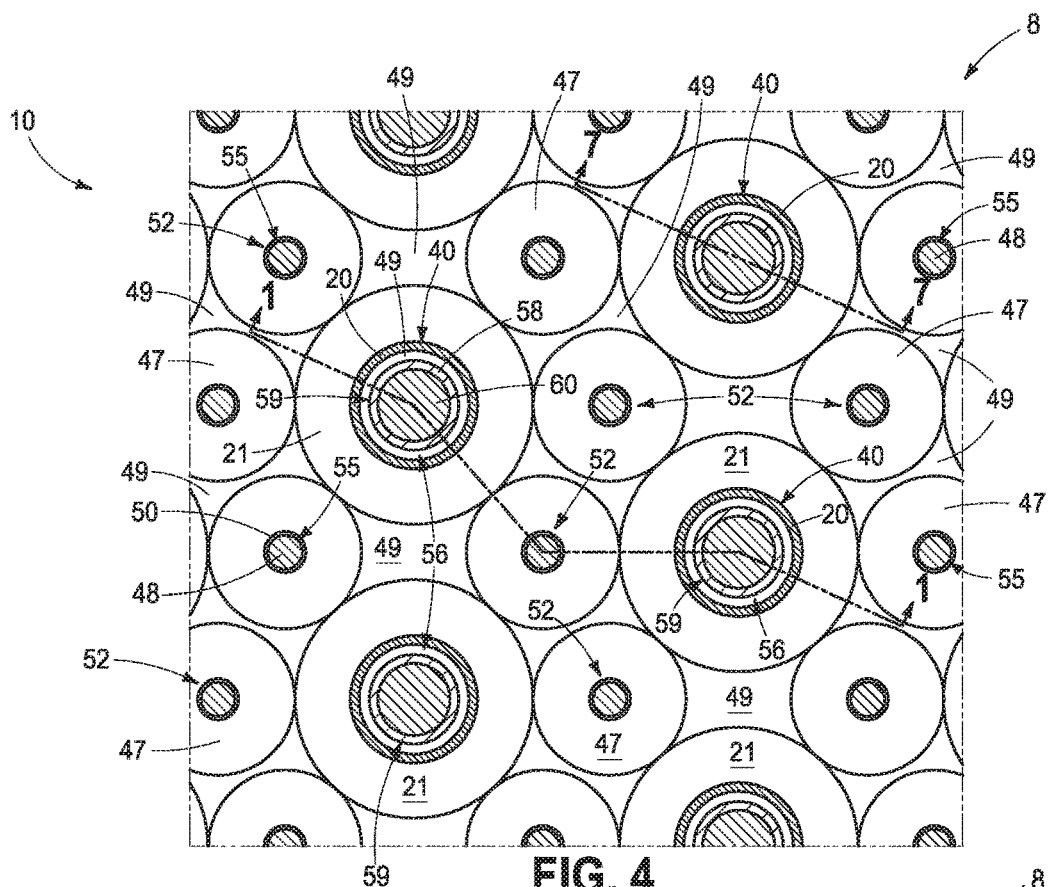
FIG. 4 is a sectional view taken through line 4-4 in FIG. 1, and is at the same smaller scale as FIG. 2.
Figure 5:
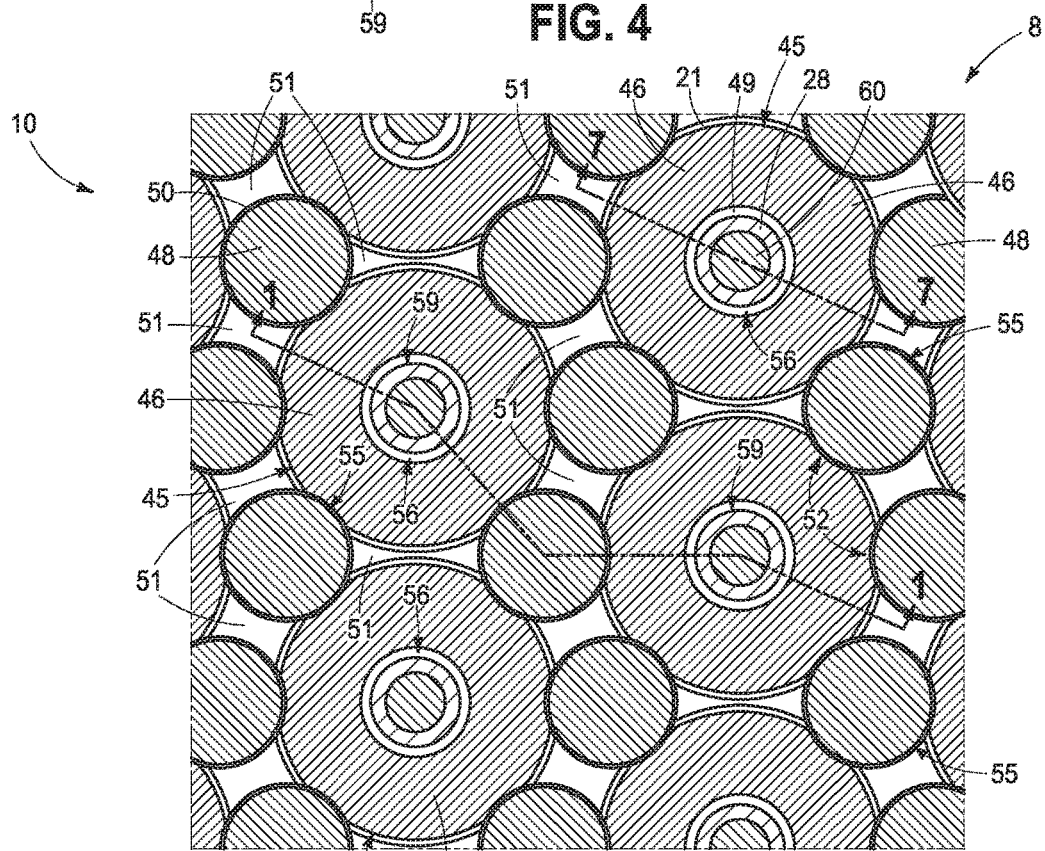
FIG. 5 is a sectional view taken through line 5-5 in FIG. 1, and is at the same smaller scale as FIG. 2.
Figure 6:
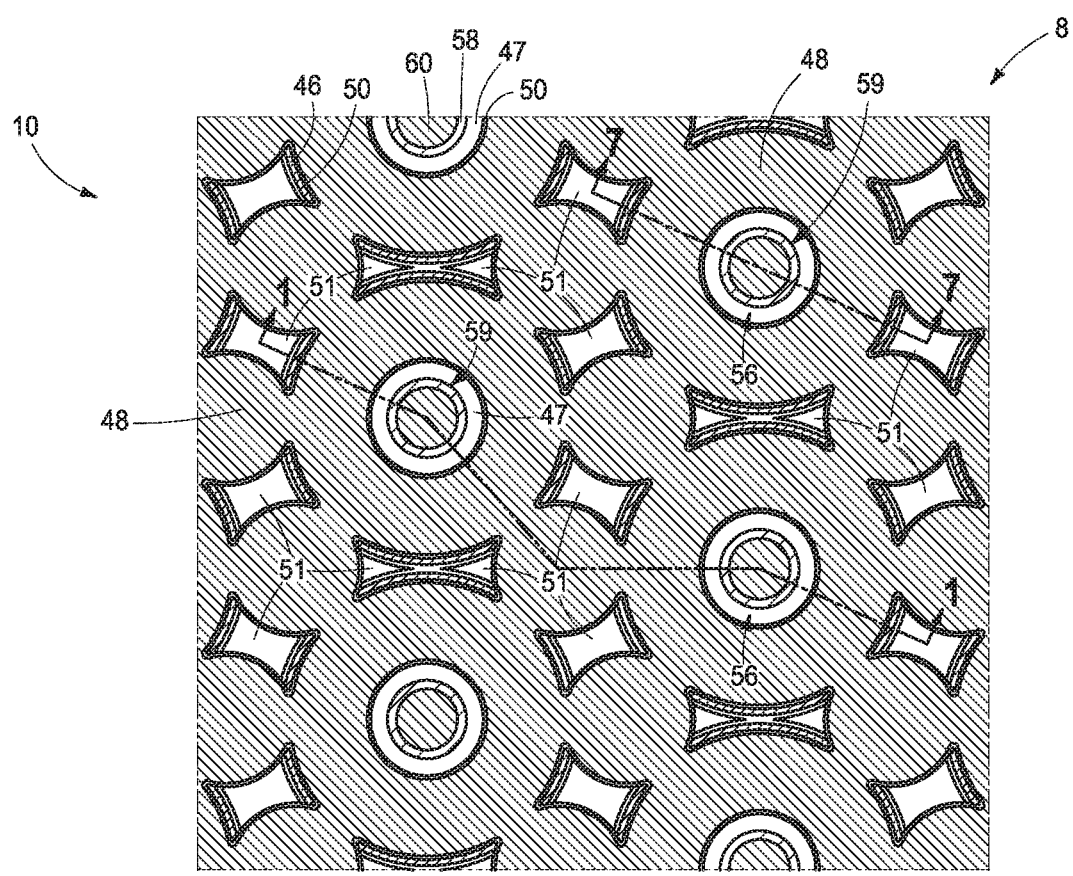
FIG. 6 is a sectional view taken through line 6-6 in FIG. 1, and is at the same smaller scale as FIG. 2.
Figure 8:
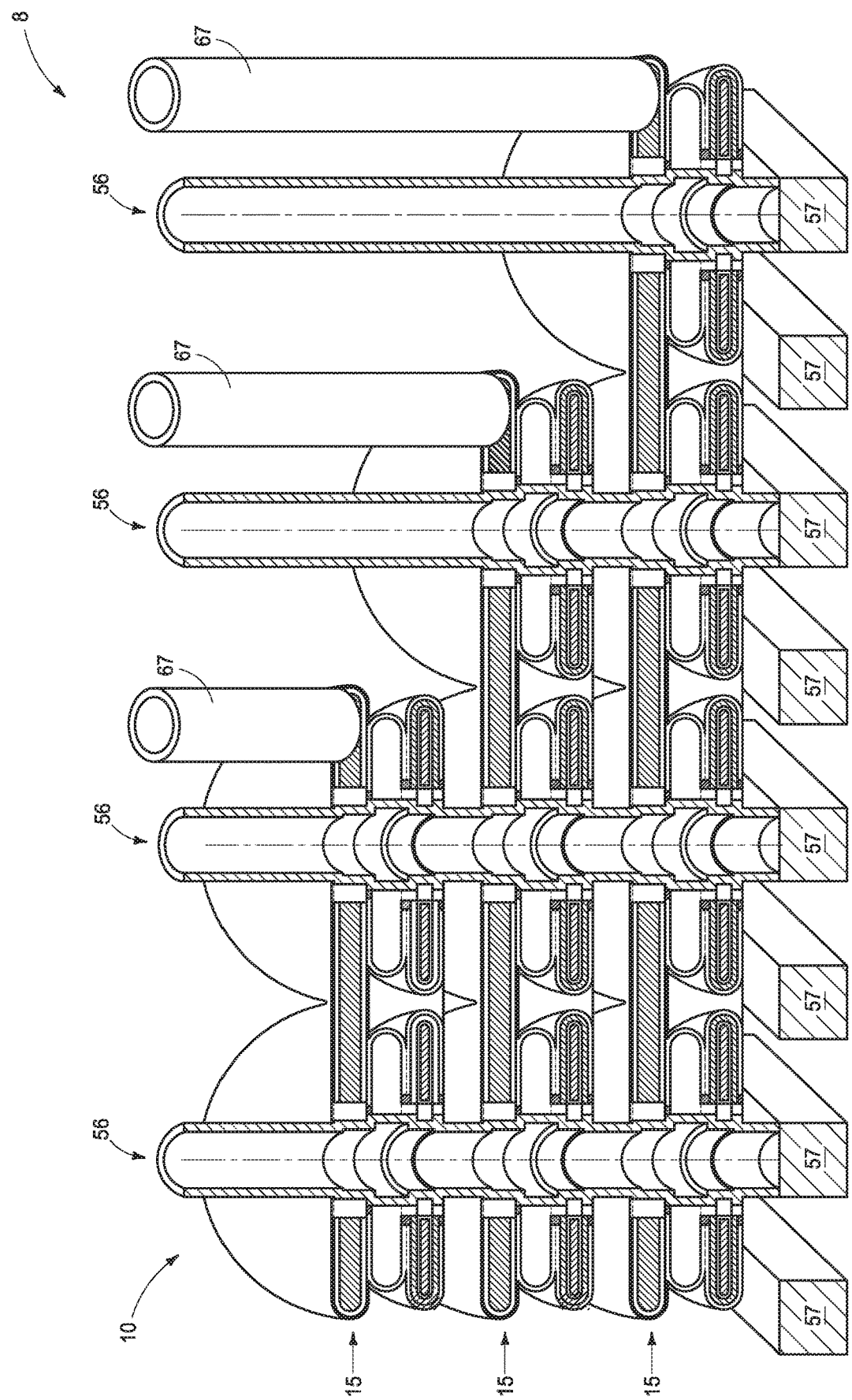
FIG. 8 is a diagrammatic partial and expanded perspective view of the FIG. 1 substrate fragment, with some components removed for clarity of other depicted components.
Figure 9:
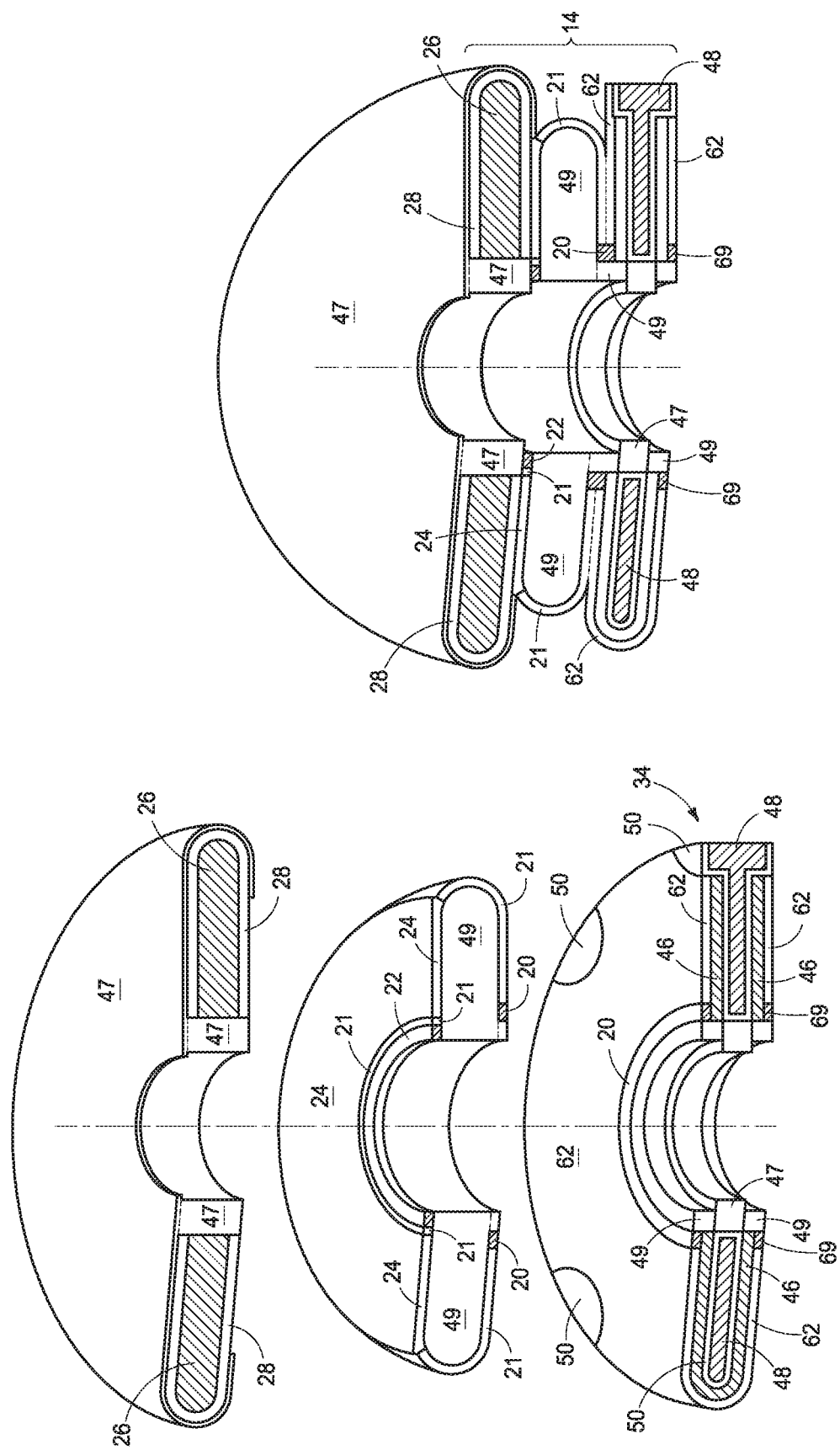
FIG. 9 is a side-by-side exploded perspective view and assembled perspective view of certain components of the FIG. 1 substrate fragment.

In one embodiment and as shown, channel region 24 comprises an annulus 40 in a straight-line horizontal cross-section (e.g., the cross-section shown by FIG. 3). In one embodiment and as shown, gate 26 comprises an annulus 44 in a straight-line horizontal cross-section. (e.g., the cross-section shown by FIG. 2). In one embodiment and as shown, multiple of gates 26 in individual memory cell tiers 14 are directly electrically coupled to one another along a conductive line 15 (FIGS. 2 and 8). Annuli 44 of immediately-laterally-adjacent gates 26 overlap one another in conductive line 15 (e.g., forming an access line 15).

Capacitor 34 comprises a pair of electrodes, for example a first electrode 46 and a second electrode 48 (e.g., conductively-doped semiconductive material and/or metal material for each), having a capacitor insulator 50 there-between (e.g., silicon dioxide, silicon nitride, hafnium oxide, other high k insulator material, and/or ferroelectric material). First electrode 46 is electrically coupled, in one embodiment directly electrically coupled, to first source/drain region 20. Second electrodes 48 of multiple of capacitors 34 in array 10 are electrically coupled, in one embodiment directly electrically coupled, with one another. In one embodiment, all such second electrodes of all capacitors in array 10 are electrically coupled with one another, and in one embodiment directly electrically coupled with one another. In one embodiment and as shown, at least one electrode (e.g., first electrode 46) of pair of electrodes 46, 48 comprises opposing C-like shapes 23 that face one another in a straight-line vertical cross-section (e.g., the cross-section shown by FIG. 7). In one embodiment and as shown, first electrode 46 comprises an annulus 45 in a straight-line horizontal cross-section (e.g., the cross-section shown by FIG. 5). An undoped silicon liner 62 may be received about first electrode 46. A heavily-doped silicon region 69 may also be present as shown, and which may be non-functional and an artifact of manufacture as described below.

In one embodiment, a capacitor-electrode structure 52 (e.g., a solid or hollow pillar, a solid or hollow wall, etc.) extends devotionally through vertically-alternating tiers 12 and 14, with individual of second electrodes 48 of individual capacitors 34 that are in different memory cell tiers 14 being electrically coupled, in one embodiment directly electrically coupled, to elevationally-extending capacitor-electrode structure 52. Example materials for capacitor-electrode structure 52 are metal materials and conductively-doped semiconductor material, and such may be of the same composition as that of second electrodes 48 as shown. In one embodiment and as shown, capacitor-electrode structure 52 extends vertically or within 10° of vertical. In one embodiment and as shown, capacitor-electrode structure 52 comprises a pillar 55, with capacitor-insulator material 50 being circumferentially about structure 52/pillar 55. In one embodiment, such, by way of example only, is one example of how second capacitor electrodes 48 of multiple of capacitors 34 that are in different memory cell tiers 14 in the array may be electrically coupled with one another. In one embodiment, capacitor-electrode structure 52 is directly electrically coupled to a horizontally-elongated capacitor-electrode construction 29 (e.g., a line or a plate) that is above or below (above being shown) vertically-alternating tiers 12 and 14. Construction(s) 29 may, in one embodiment, directly electrically couple together all second electrodes 48 within the array.

In one embodiment, at least one more capacitor-electrode structure extends elevationally through the vertically-alternating tiers, with the individual second electrodes of the individual capacitors that are in different memory cell tiers being electrically coupled to the at least one more elevationally-extending capacitor-electrode structure. In one such embodiment, more than one more capacitor-electrode structure extends elevationally through the vertically-alternating tiers. In one such latter embodiment, the capacitor-electrode structures are circumferentially spaced about the first electrode. For example, and by way of example only, six capacitor-electrode structures 52 are shown received about individual first capacitor electrodes 46.

A sense line is electrically coupled, in one embodiment directly electrically coupled, to multiple of the second source/drain regions of individual of the transistors that are in different memory cell tiers 14. In one embodiment and as shown, a sense-line structure 56 (e.g., a solid or hollow pillar, a solid or hollow wall, etc.) extends elevationally through vertically-alternating tiers 12 and 14, with individual of second source/drain regions 22 of individual transistors 25 that are in different memory cell tiers 14 being electrically coupled, in one embodiment directly electrically coupled, thereto. In one embodiment and as shown, sense-line structure 56 extends vertically or within 10° of vertical. In one embodiment and as shown, sense-line structure 56 comprises a pillar 59. In one embodiment and as shown, sense-line structure 56 comprises a peripheral conductively-doped semiconductive material 58 (e.g., polysilicon) and a central metal material core 60 (e.g., titanium nitride and/or tungsten). In one embodiment, sense-line structure 56 is directly electrically coupled to a horizontal longitudinally-elongated sense line 57 (FIGS. 1 and 8) that is above or below (below as shown) vertically-alternating tiers 12 and 14. FIG. 8 shows contacts/vias 67 extending to individual lines 15 (e.g., access lines/word lines) in an example staircase area/region of array 10. Insulative material 16 is not shop in FIG. 8 for clarity of other components.

Example insulator material 47 (e.g., silicon nitride), insulator material 49 (e.g., silicon dioxide), and non-conductive material 51 (e.g., undoped amorphous silicon or undoped polysilicon) may be provided as shown for suitable isolation in sub-tiers of memory cell tiers 14.

Figure 10:
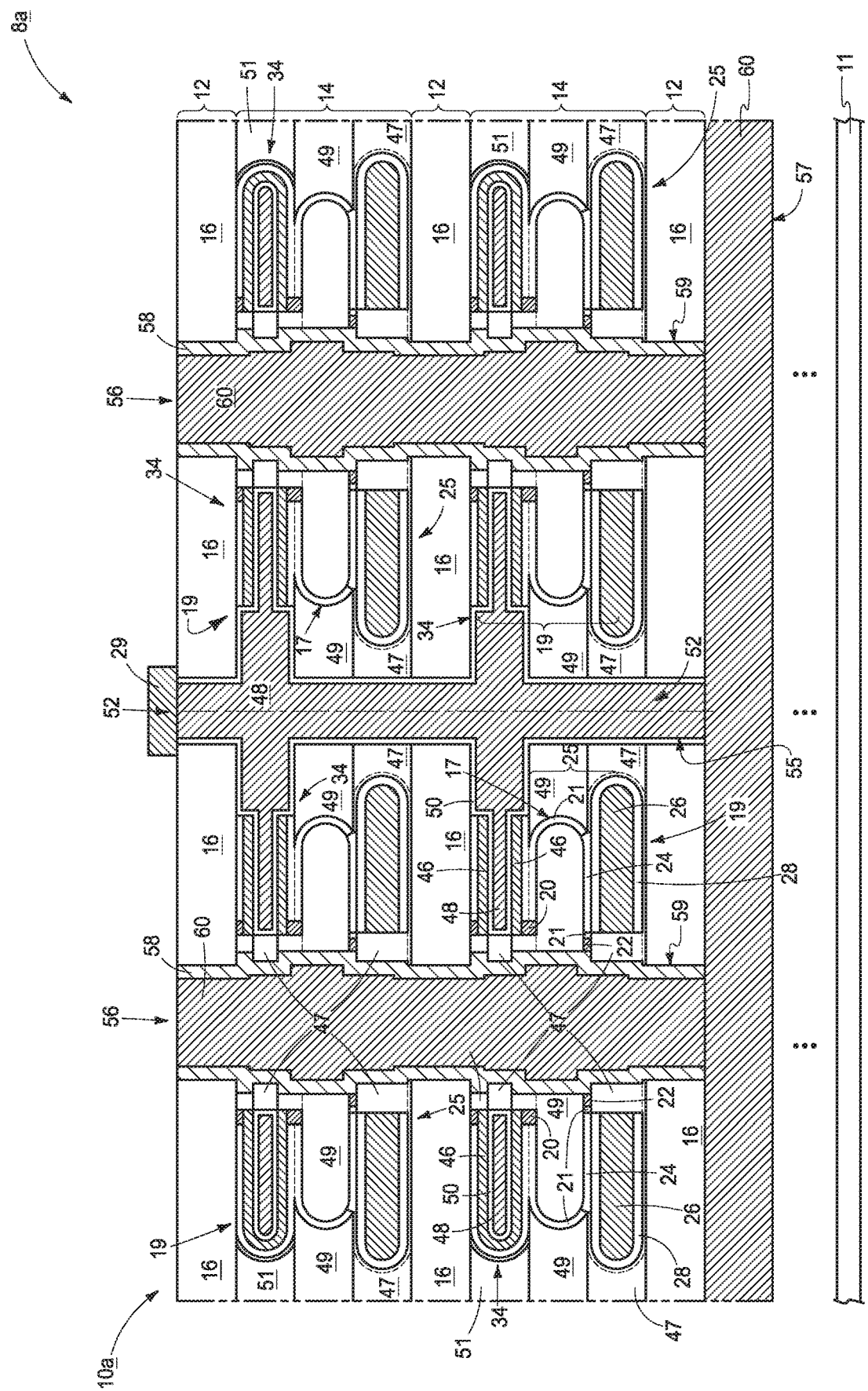
FIG. 10 is a diagrammatic sectional view of another substrate fragment comprising a memory array in accordance with an embodiment of the invention.

In individual memory cells 19, one of (a) the channel region of the transistor, or (b) the first and second electrodes of the capacitor, is directly above the other of (a) and (b). FIGS. 1-9 show an embodiment where (a) is above (b) (i.e., in FIGS. 1-9, channel region 24 of transistor 25 is directly above first electrode 46 and second electrode 48 capacitor 34). An alternate embodiment construction 8a is shown in FIG. 10 (corresponding to the FIG. 2 view). Like numerals from the above-described embodiments have been used where appropriate, with some construction differences being indicated with the suffix "a". In FIG. 10, (b) is above (a) (i.e., in FIG. 10, first electrode 46 and second electrode 48 of capacitor 34 are directly above channel region 26 of transistor 25). Any other attribute(s) or aspect(s) as shown and/or described herein with respect to other embodiments may be used.

The above example structures may be manufactured by any existing or yet-to-be-developed techniques. One example technique of manufacturing the embodiment shown by FIGS. 1-9 is described with reference to FIGS. 11-54. Like numerals from the above-described embodiments have been used for predecessor construction(s), regions, and like/predecessor materials thereof.

Figure 11:
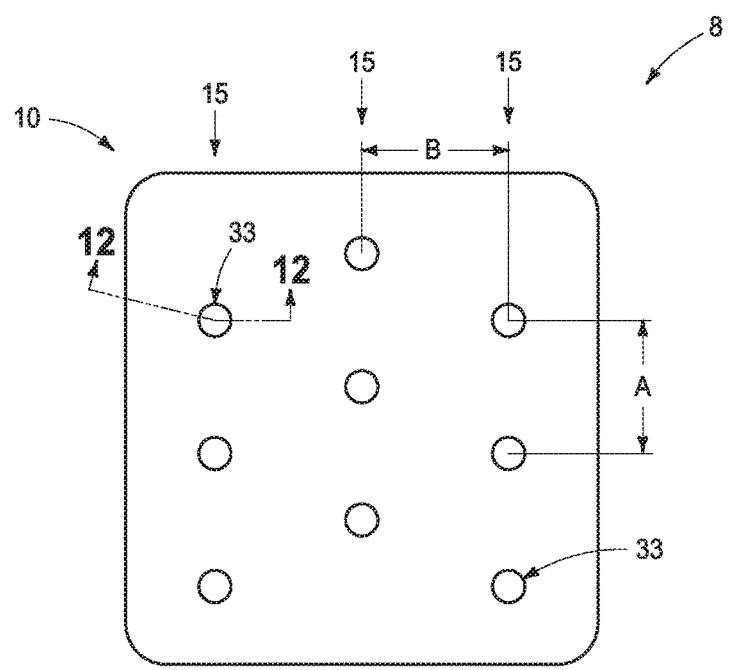
FIG. 11 is a diagrammatic sectional view of a predecessor substrate to that shown by FIGS. 1-9, is taken through line 11-11 in FIG. 12.
Figure 12:
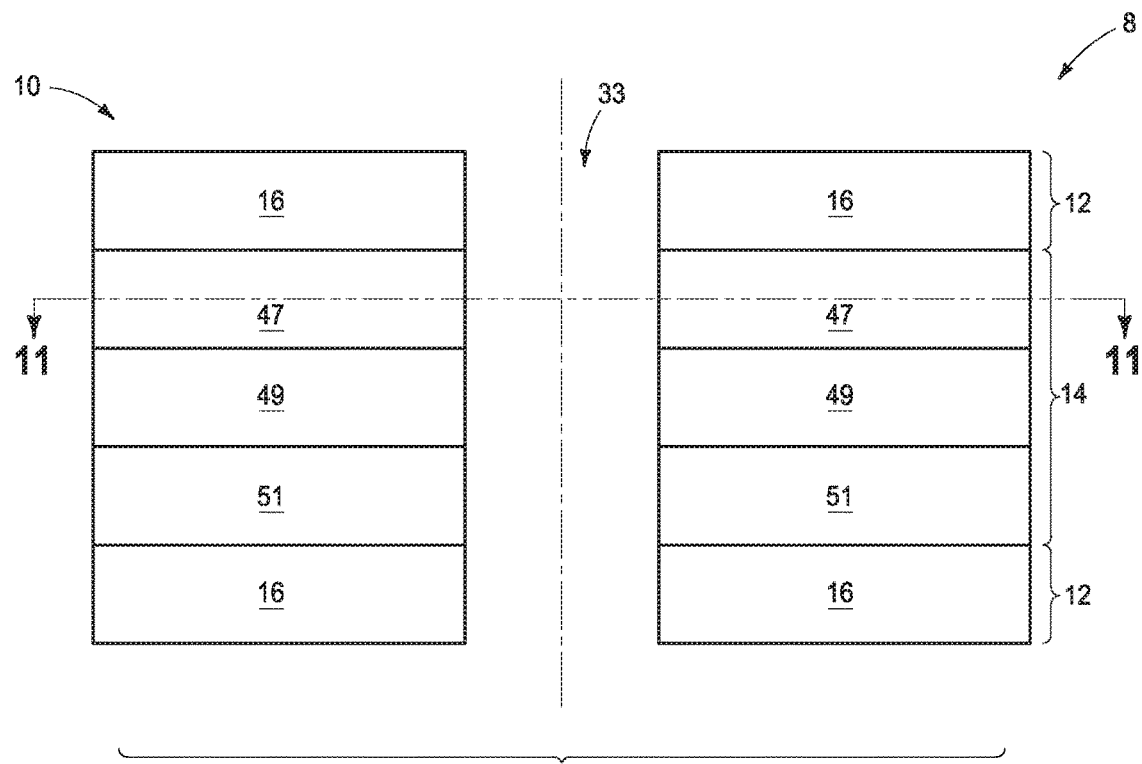
FIG. 12 is a sectional view of the FIG. 11 substrate taken through line 12-12 in FIG. 11, and at a larger scale than FIG. 11.

FIGS. 11 and 12 show an example portion of a predecessor to the construction or stack of FIGS. 1-9, and which for brevity only shows two insulative-material tiers 12 having what will be a memory cell tier 14 there-between. Sense lines 57 (not shown) would have been formed previously. The person of skill in the art may select any suitable different combinations of materials recognizing, in accordance with the continuing description, that certain materials will be etched selectively relative to other materials in the example method. As examples, and consistent with those described above, example material 16 for insulative material tiers 12 is carbon-doped silicon nitride (2 to 10 atomic percent carbon). An example thickness for insulative material 16 is 200 to 500 Angstroms. Each of materials or layers 47, 49, and 51 may be considered as a sub-tier within what will be memory cell tiers 14. Example thickness for each of materials 47, 49, and 51 is 200 to 400 Angstroms, with example materials being silicon nitride, silicon dioxide, and amorphous silicon, respectively. Openings 33 have been formed in and through the depicted stack of materials in an offset or staggered manner. The centers of example openings 33 are centered relative to what will be the centers of sense-lines structures 56 and annuli 40, 41, 42, 44, and 45. FIG. 11 shows three example lines 15 of openings 33 wherein a spacing "A" between immediately-adjacent centers of openings 33 within a line 15 is different from an analogous lateral spacing "B" between lines 15, specifically with B being greater than A.

Figure 13:
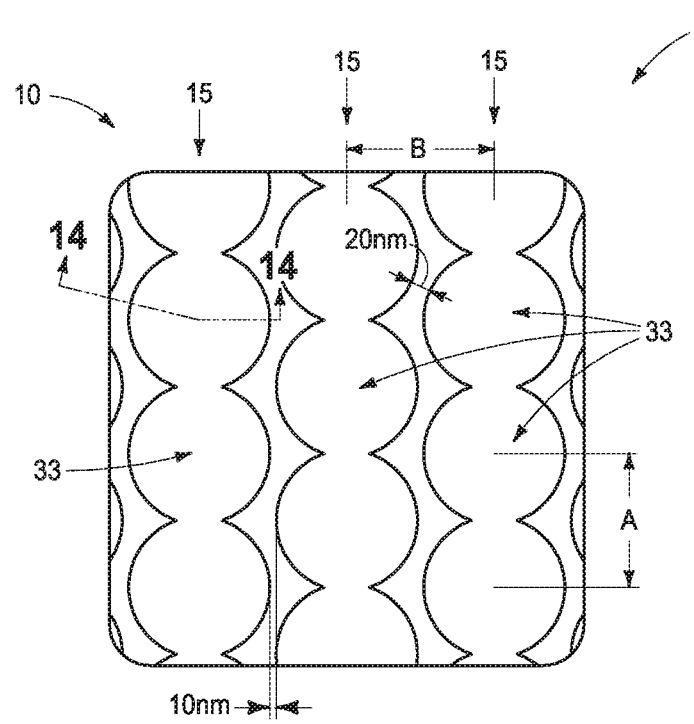
FIG. 13 is a sectional view of the FIG. 11 substrate at a processing step subsequent to that shown by FIG. 11, and is taken through line 13-13 in FIG. 14.
Figure 14:
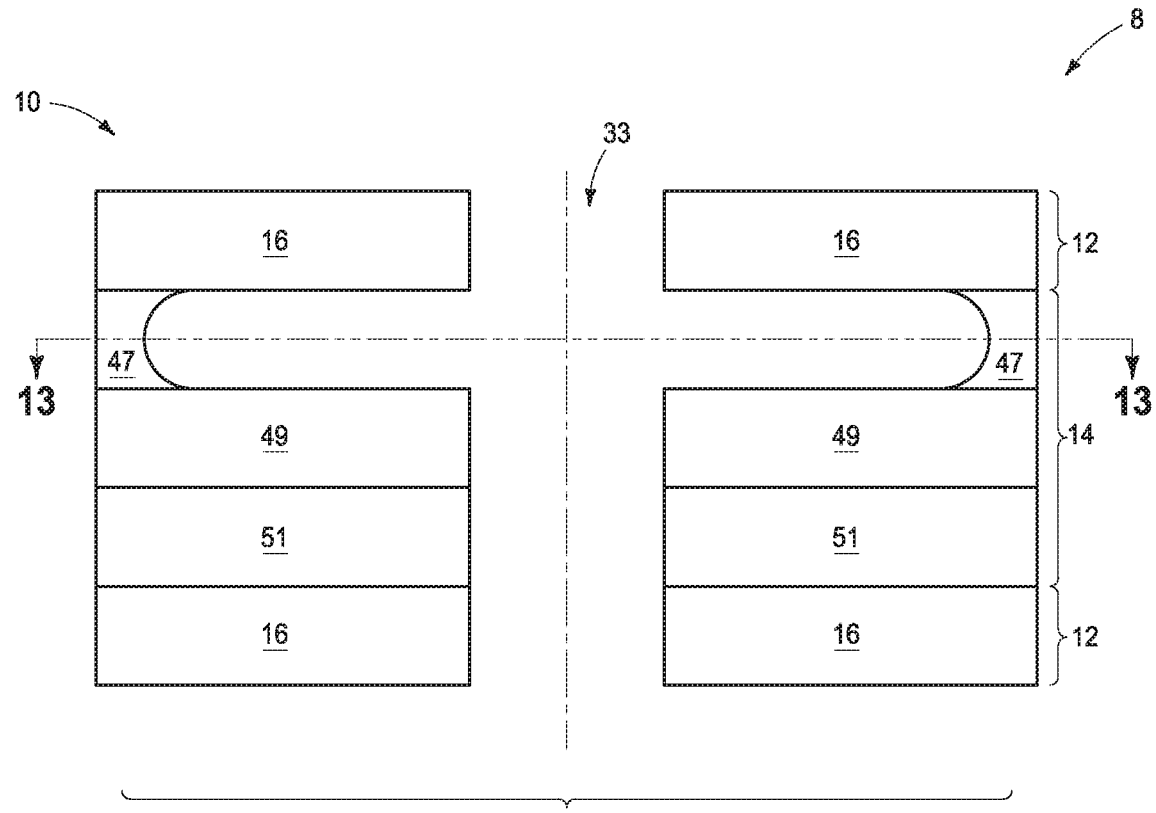
FIG. 14 is a sectional view taken through line 14-14 in FIG. 13, and is at the same larger scale as FIG. 12.

Referring to FIGS. 13 and 14, substrate construction 8 of FIGS. 11 and 12 has been subjected to suitable etching whereby material 47 has been etched laterally/radially selectively relative to the other depicted materials effective to widen openings 33 to join within lines 15 but not to join laterally (B being slightly larger than A). With respect to the above example materials, an example etching chemistry is hot phosphoric acid, with such etch being conducted in a timed manner. By way of examples only, 20 nm and 10 nm diagonal and lateral separation distances, respectively, are shown.

Figure 15:
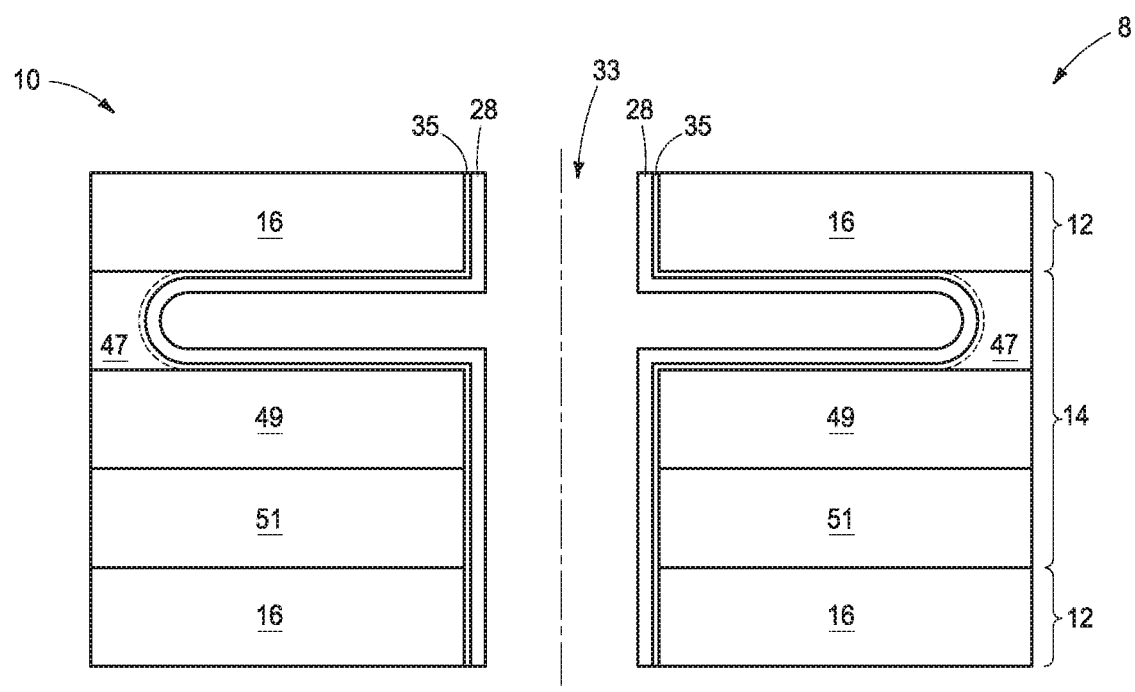
FIG. 15 is a sectional view of the FIG. 14 substrate at a processing step subsequent to that shown by FIG. 14, and is at the same larger scale as FIG. 12.

Referring to FIG. 15, a silicon nitride liner 35 (e.g., 35 Angstroms, and not designated in FIGS. 1-10 as ideally it is the same material as material 47) and gate insulator 28 (e.g., 50 Angstroms) have been formed within the original and widened openings 33 as shown. Gate insulator 28 may be silicon dioxide that is subjected to in situ steam generation for densification (e.g., at 650° C. to 1000° C., atmospheric or sub-atmospheric pressure, and in the presence of $O_2$ and $H_2$).

Figure 16:
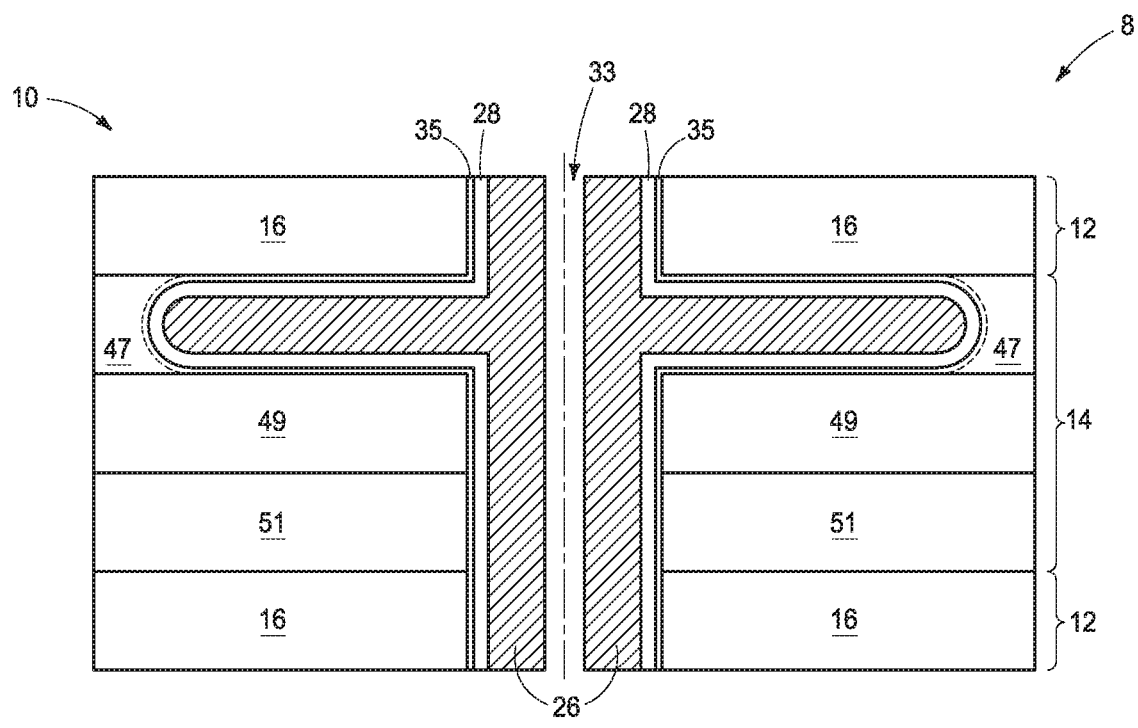
FIG. 16 is a sectional view of the FIG. 15 substrate at a processing step subsequent to that shown by FIG. 15, and is at the same larger scale as FIG. 12.

Referring to FIG. 16, gate material 26 (e.g., all titanium nitride, or a titanium nitride liner with the remaining volume filled with elemental tungsten) has been deposited to within openings 33 sufficient to fill the laterally-widened portions thereof, but ideally not sufficient to fill the central portion of the narrower part of such openings.

Figure 17:
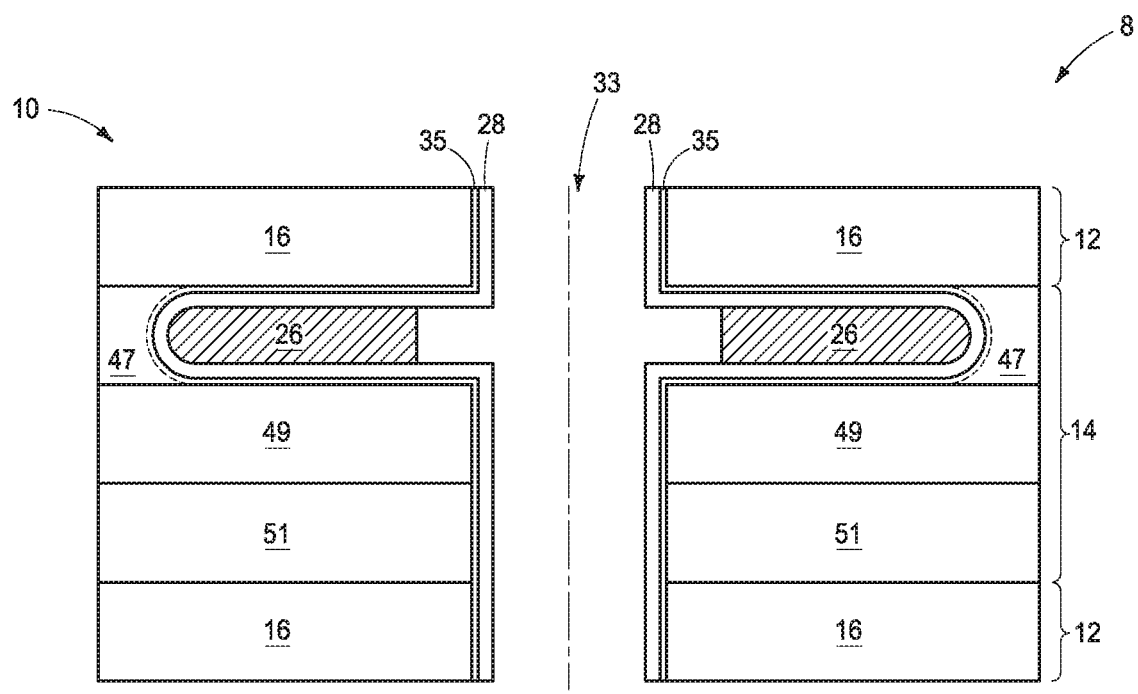
FIG. 17 is a sectional view of the FIG. 16 substrate at a processing step subsequent to that shown by FIG. 16, and is at the same larger scale as FIG. 12.

Referring to FIG. 17, gate material 26 has been subjected to a suitable etch to recess it to set the channel length (e.g. 200 Angstroms). An example chemistry to etch titanium nitride and elemental tungsten selectively relative to the other example materials comprises a combination of sulfuric acid and hydrogen peroxide.

Figure 18:
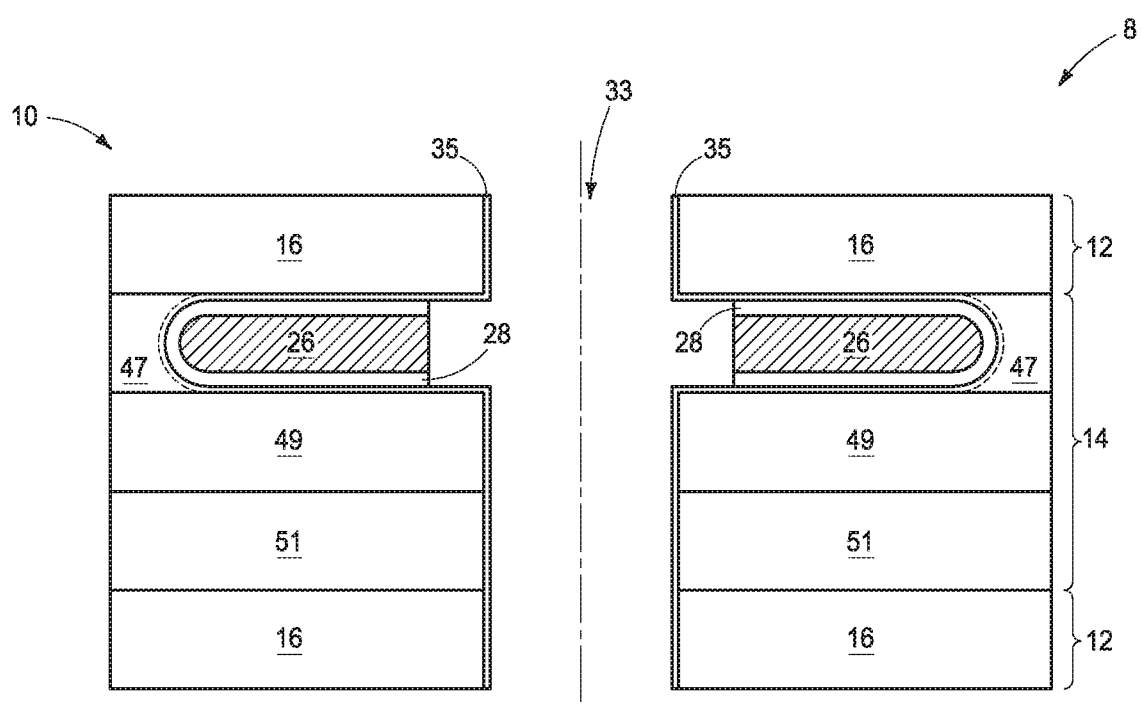
FIG. 18 is a sectional view of the FIG. 17 substrate at a processing step subsequent to that shown by FIG. 17, and is at the same larger scale as FIG. 12.

Referring to FIG. 18, example oxide gate insulator 28 has been etched selectively relative to other exposed materials (e.g., using dilute HF) to form the illustrated construction.

Figure 19:
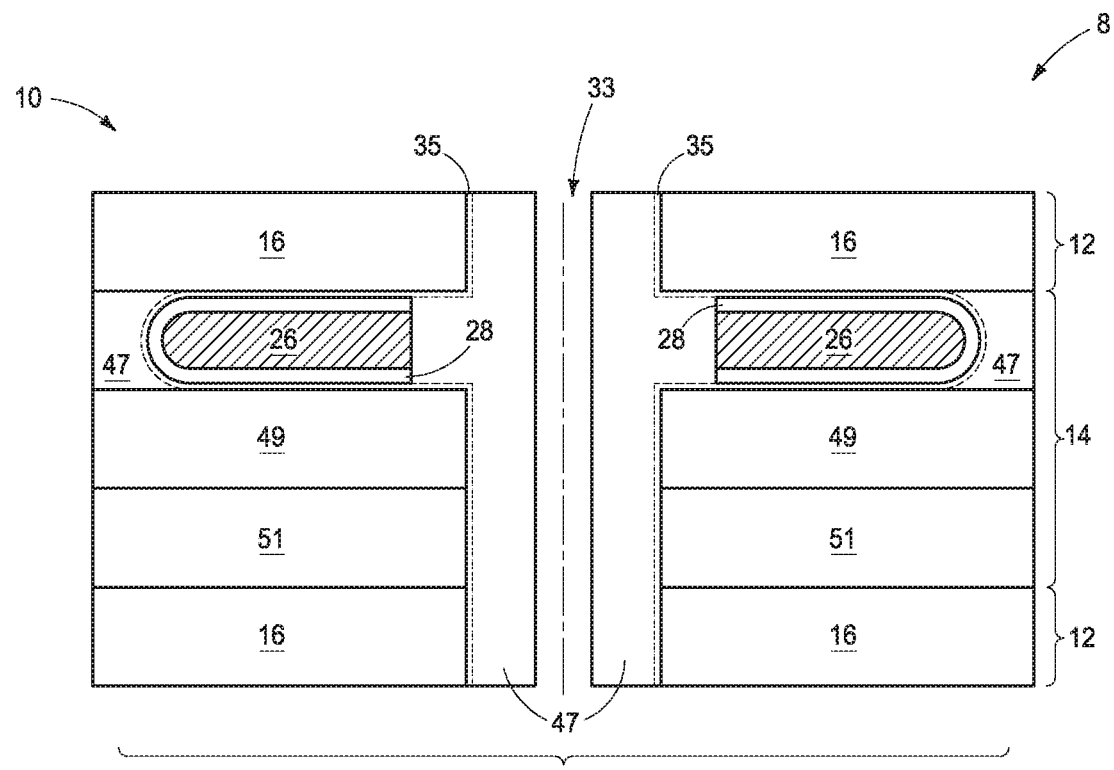
FIG. 19 is a sectional view of the FIG. 18 substrate at a processing step subsequent to that shown by FIG. 18, and is at the same larger scale as FIG. 12.
Figure 20:
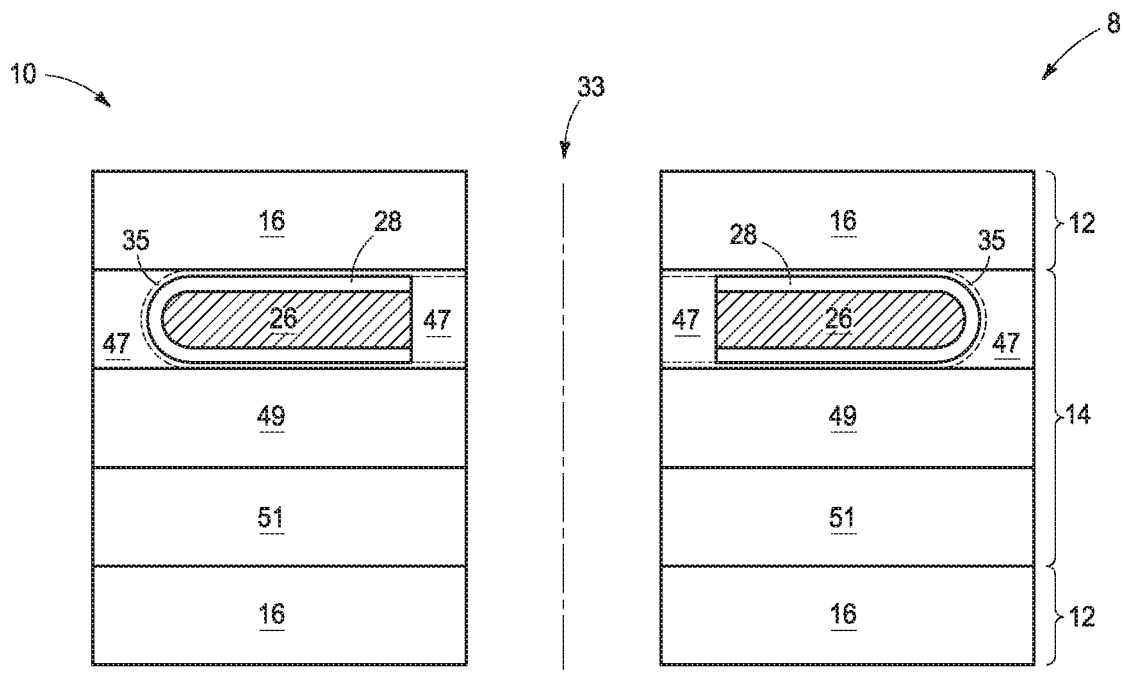
FIG. 20 is a sectional view of the FIG. 19 substrate at a processing step subsequent to that shown by FIG. 19, and is at the same larger scale as FIG. 12.

Referring to FIG. 19, more silicon-nitride-insulator material 47 has been deposited effective to fill the depicted recesses/gaps that were formed by the etching shown in FIG. 18. FIG. 20 shows removal of such material 47 from within the narrower portions of openings 33, for example by using phosphoric acid or any suitable dry anisotropic etching chemistry.

Figure 21:
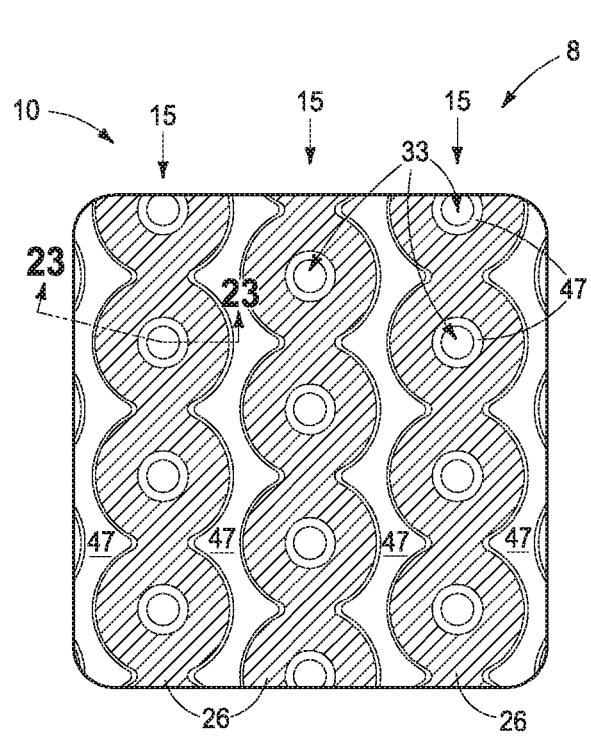
FIG. 21 is a sectional view of the FIG. 20 substrate at a processing step subsequent to that shown by FIG. 20, is taken through line 21-21 in FIG. 23, and is at the same scale as FIG. 11.
Figure 22:
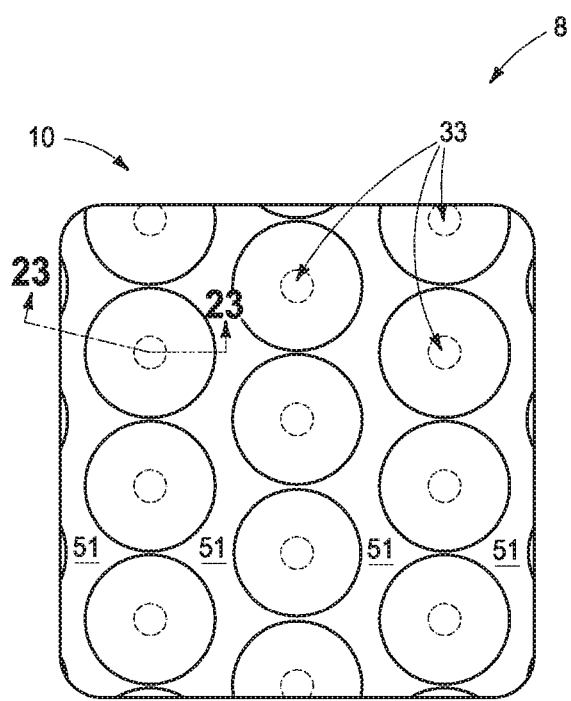
FIG. 22 is a sectional view taken through line 22-22 in FIG. 23, and is at the same scale as FIG. 11.
Figure 23:
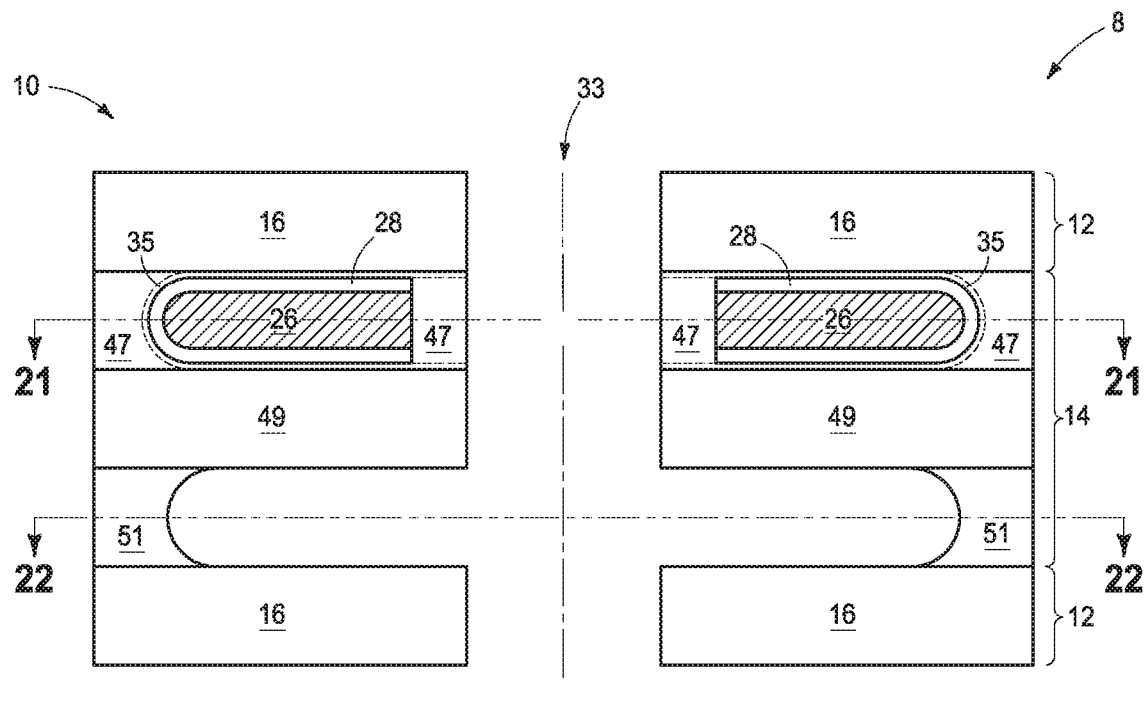
FIG. 23 is a sectional view taken through line 23-23 in FIGS. 21 and 22, and is at the same larger scale as FIG. 12.

Referring to FIGS. 21-23, material 51 (e.g., amorphous silicon) has been subjected to a suitable etch selectively relative to the other depicted materials to widen openings 33 therein for ultimate formation of the capacitors. An example etching chemistry for the stated materials for selectively etching material 51 is tetramethylammonium hydroxide (TMAH) or a fluorocarbon-based dry etching chemistry. Such may be conducted by a timed etch that is sufficiently controlled to preclude the widened openings form joining or bridging with any immediately-adjacent opening within material 51. FIG. 21 shows example word line constructions 15 that were essentially completed as-described above with respect to FIGS. 16-20.

Figure 24:
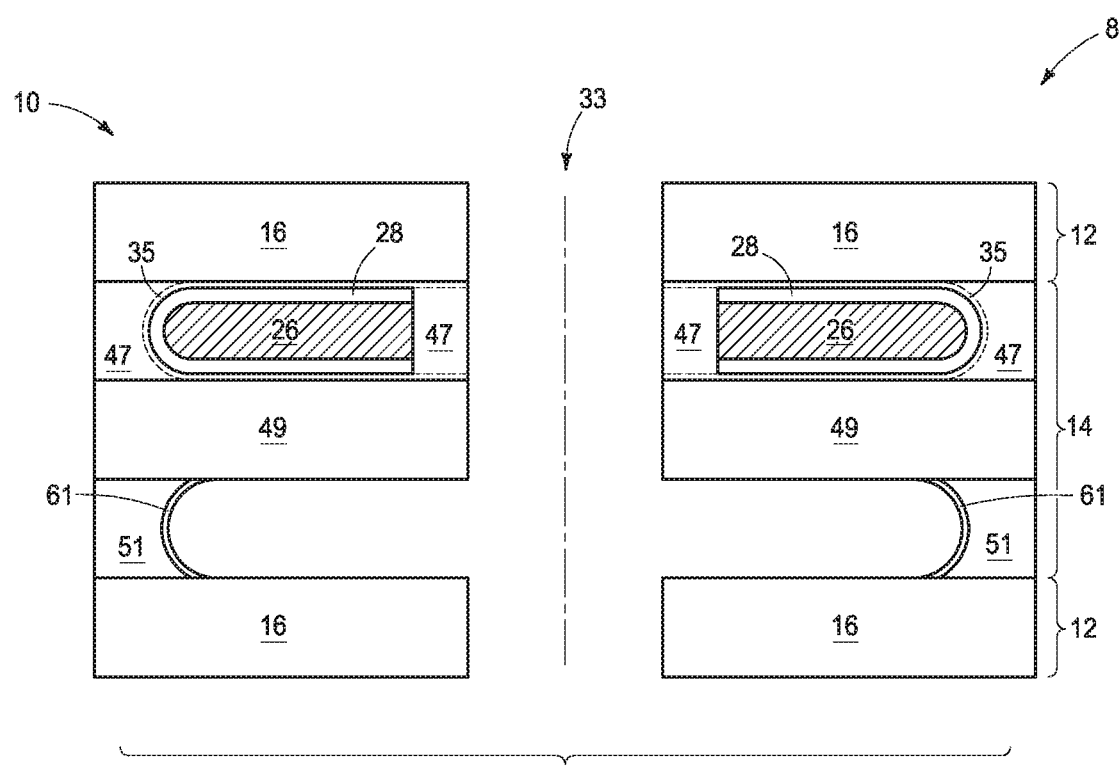
FIG. 24 is a sectional view of the FIG. 23 substrate at a processing step subsequent to that shown by FIG. 23, and is at the same larger scale as FIG. 12.

Referring FIG. 24, native oxide 61 (e.g., 10 Angstroms) has been formed peripherally on material 51.

Figure 25:
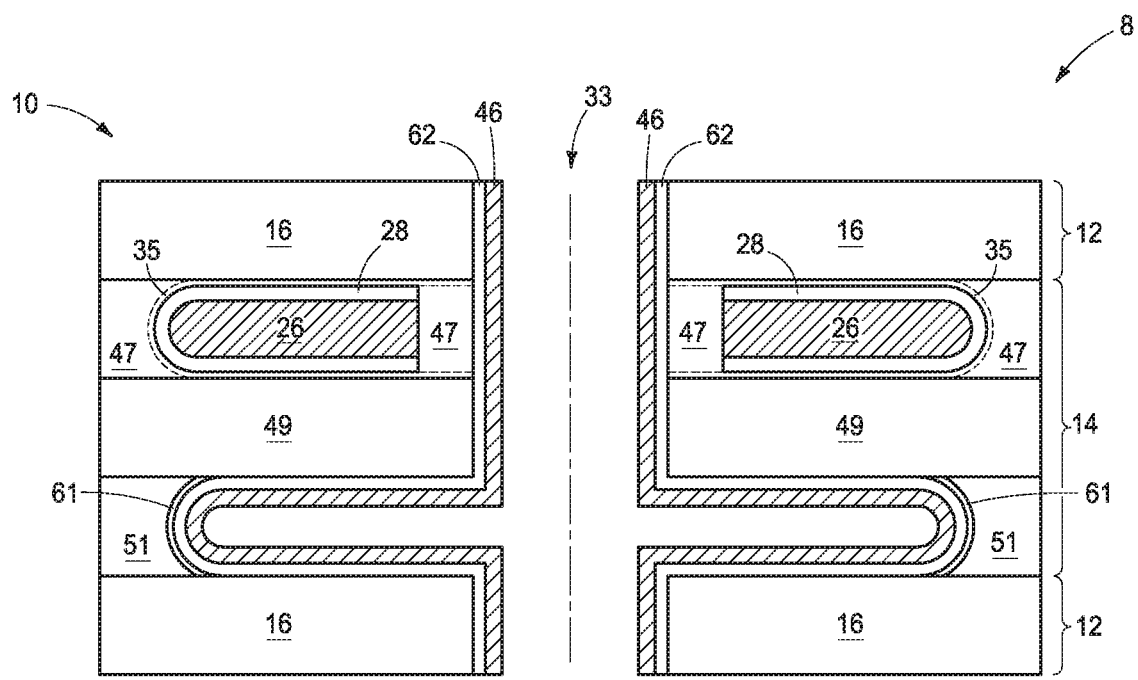
FIG. 25 is a sectional view of the FIG. 24 substrate at a processing step subsequent to that shown by FIG. 24, and is at the same larger scale as FIG. 12.

Referring to FIG. 25, an undoped silicon liner 62 (e.g., 30 Angstroms) has been deposited, followed by deposition of conductive material 46 (e.g., 40 Angstroms of titanium nitride) for ultimate formation of first capacitor electrodes 46.

Figure 26:
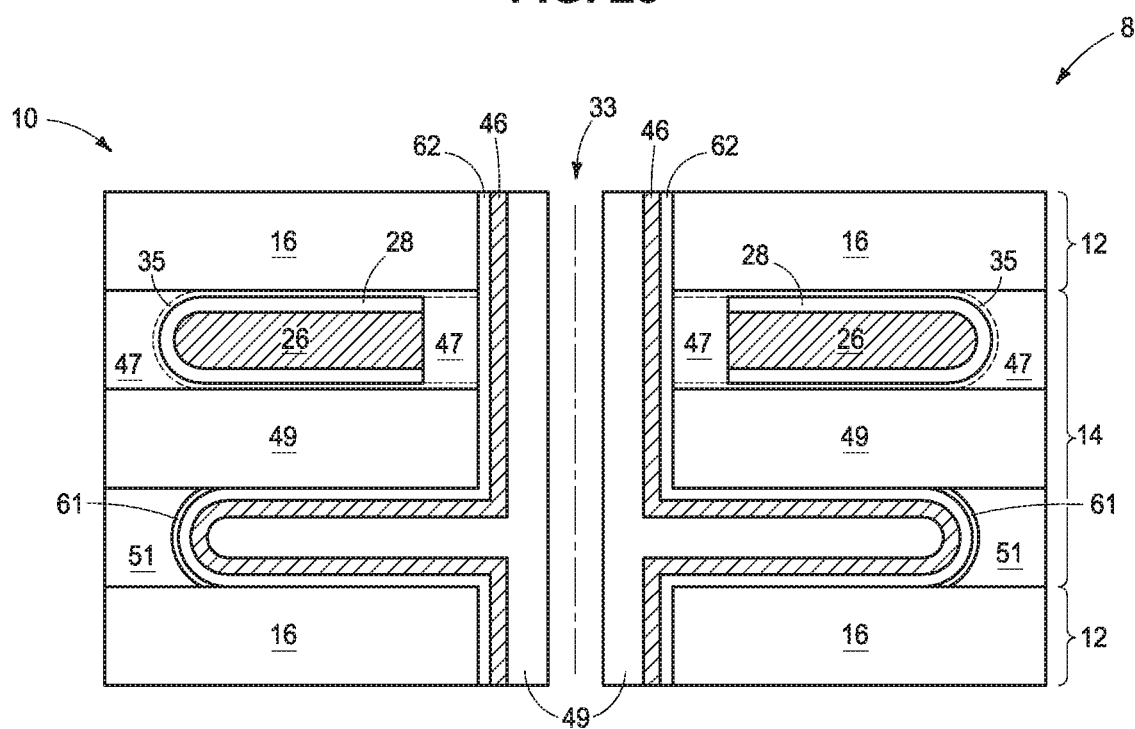
FIG. 26 is a sectional view of the FIG. 25 substrate at a processing step subsequent to that shown by FIG. 25, and is at the same larger scale as FIG. 12.

Referring to FIG. 26, example silicon-dioxide-insulator material 49 (e.g., silicon dioxide) has been deposited sufficient to fill remaining volume of widened openings 33 in material 51, but ideally not sufficient to fill remaining volume of the narrowest portions of openings 33.

Figure 27:
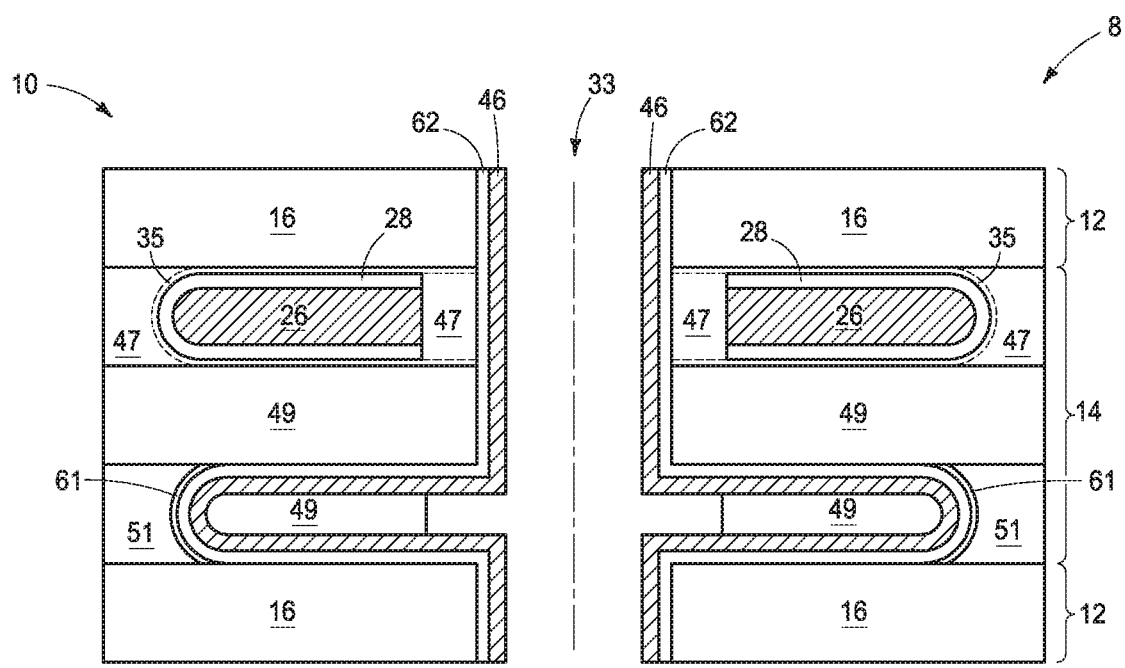
FIG. 27 is a sectional view of the FIG. 26 substrate at a processing step subsequent to that shown by FIG. 26, and is at the same larger scale as FIG. 12.

Referring to FIG. 27, example silicon-dioxide-insulator material 49 has been subjected to a suitable timed etch to selectively laterally/radially recess such as shown (e.g., using dilute HF), for example to leave a lateral annular thickness of material 49 of about 200 Angstroms.

Figure 28:
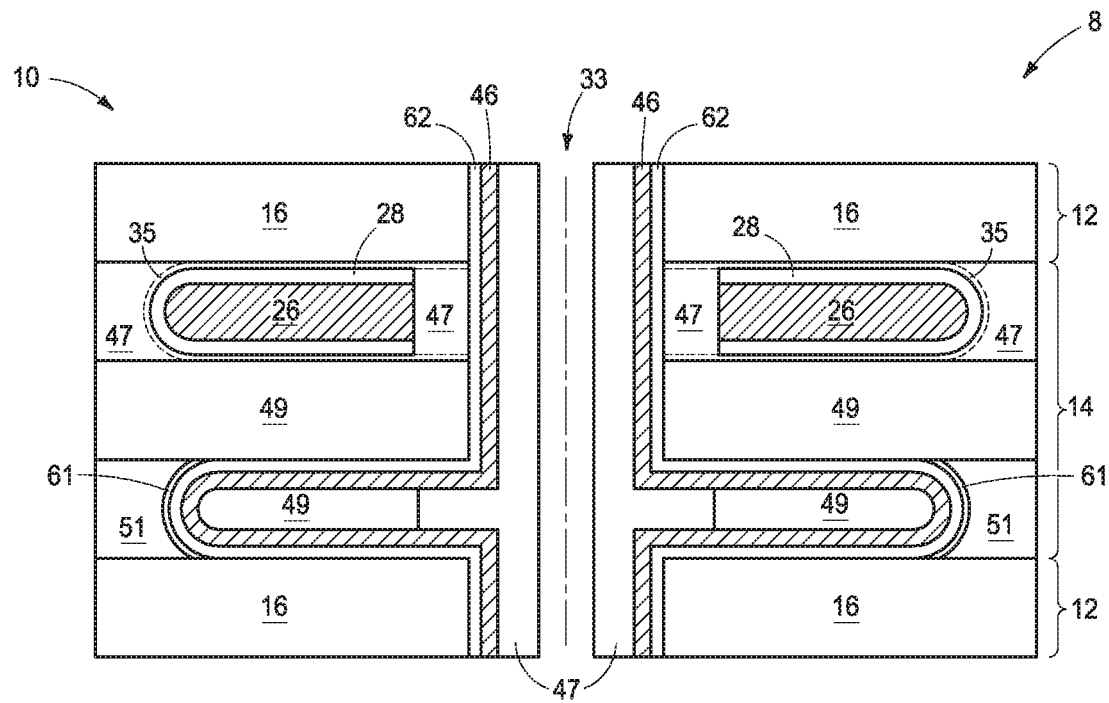
FIG. 28 is a sectional view of the FIG. 27 substrate at a processing step subsequent to that shown by FIG. 27, and is at the same larger scale as FIG. 12.
Figure 29:
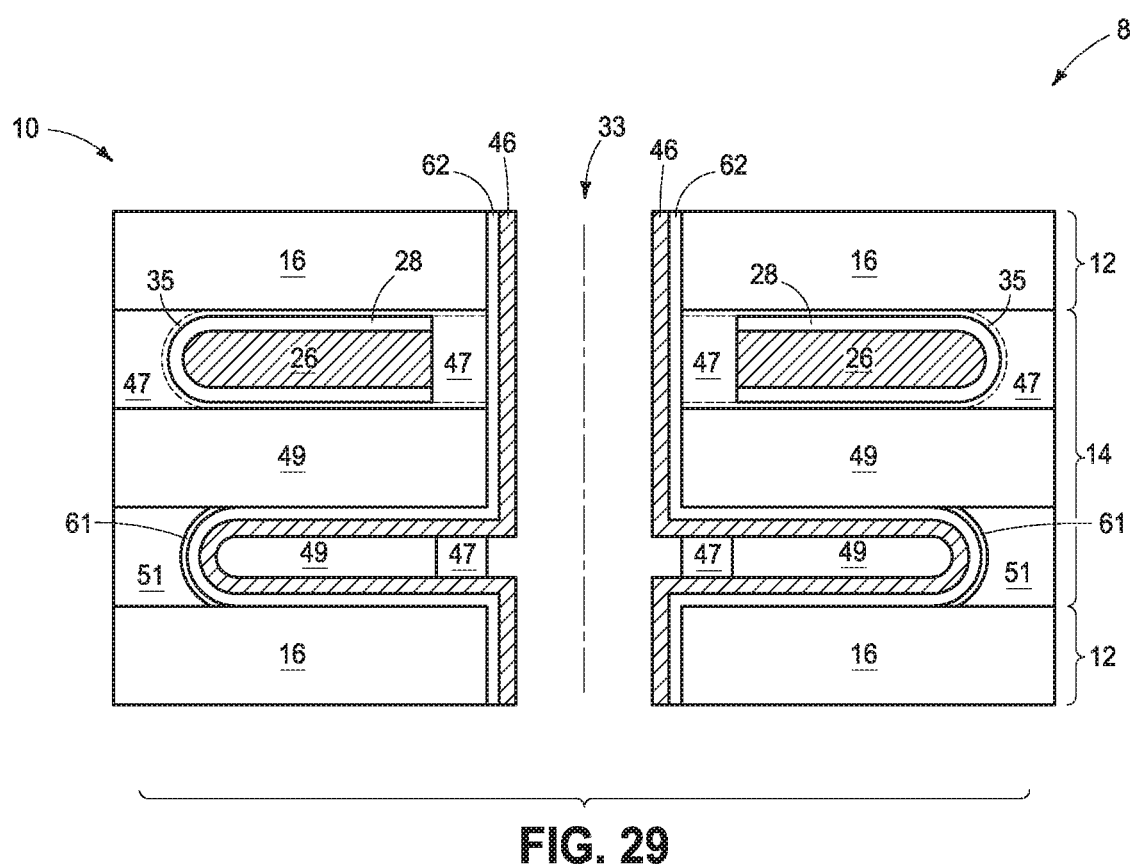
FIG. 29 is a sectional view of the FIG. 28 substrate at a processing step subsequent to that shown by FIG. 28, and is at the same larger scale as FIG. 12.

Referring to FIG. 28, example silicon-nitride-insulator material 47 has been deposited to fill such remaining recesses. Referring to FIG. 29, such silicon nitride 47 has been subjected to a suitable selective etch (e.g., phosphoric acid) to recess such as-shown.

Figure 30:
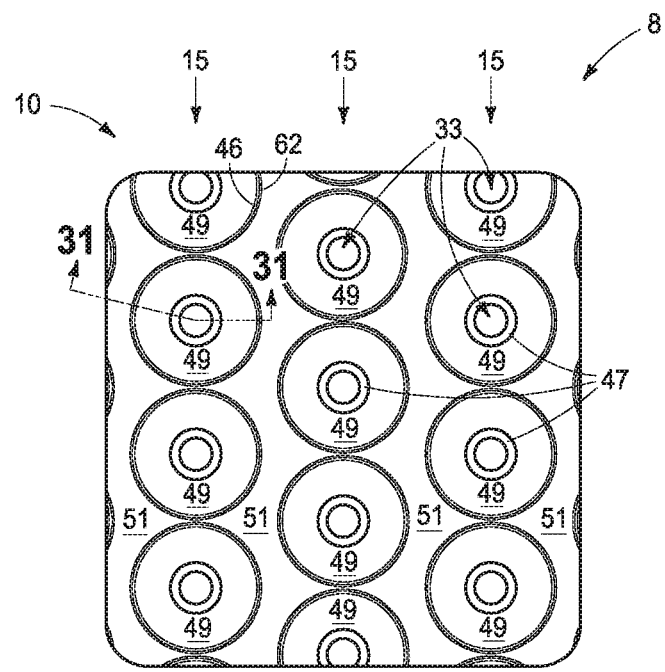
FIG. 30 is a sectional view of the FIG. 29 substrate at a processing step subsequent to that shown by FIG. 29, is taken through line 30-30 in FIG. 31, and is at the same scale as FIG. 11.
Figure 31:
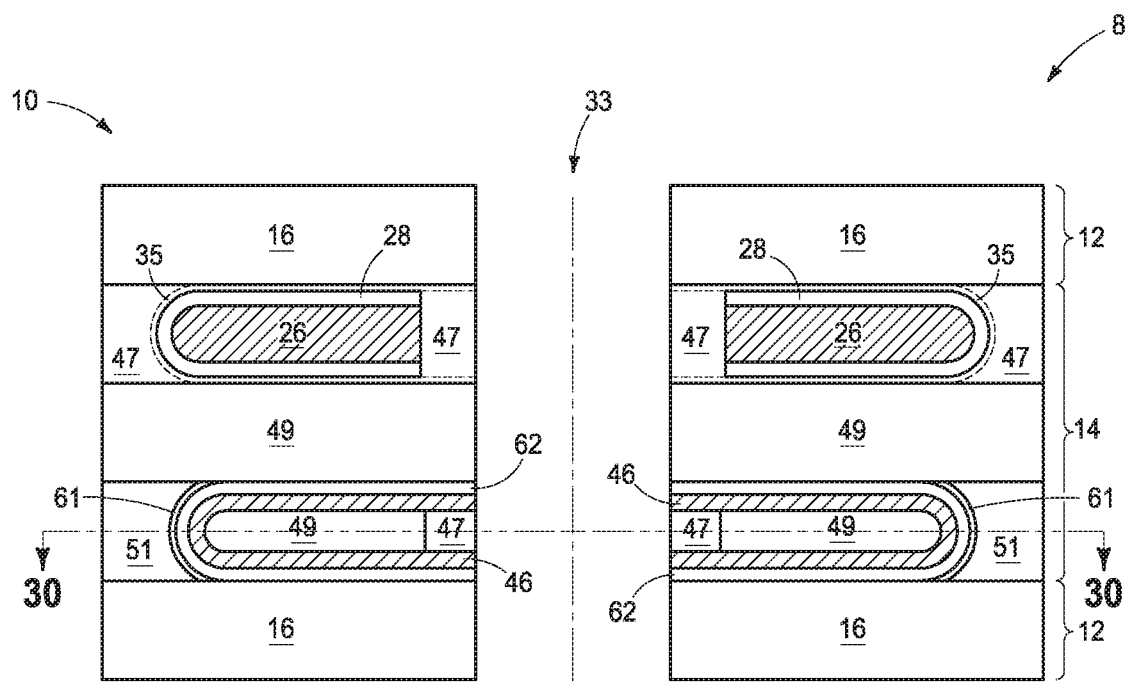
FIG. 31 is a sectional view taken through line 31-31 in FIG. 30, and is at the same larger scale as FIG. 12.

Referring to FIGS. 30 and 31, example conductive titanium nitride material 46 has been etched from remaining openings 33 (e.g., using sulfuric acid and hydrogen peroxide, followed by subsequent removal of silicon liner 62 from sidewalls of openings 33 (e.g., using dilute HF).

Figure 32:
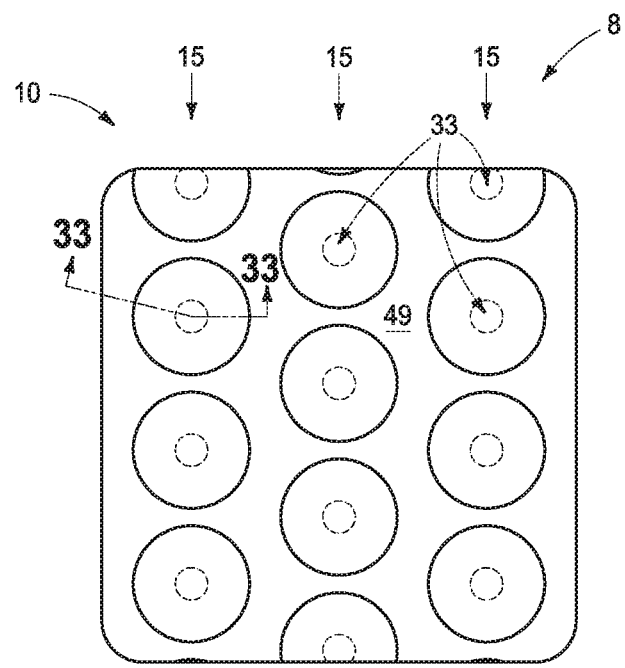
FIG. 32 is a sectional view of the FIG. 30 substrate at a processing step subsequent to that shown by FIG. 30, and is taken through line 32-32 in FIG. 33.
Figure 33:
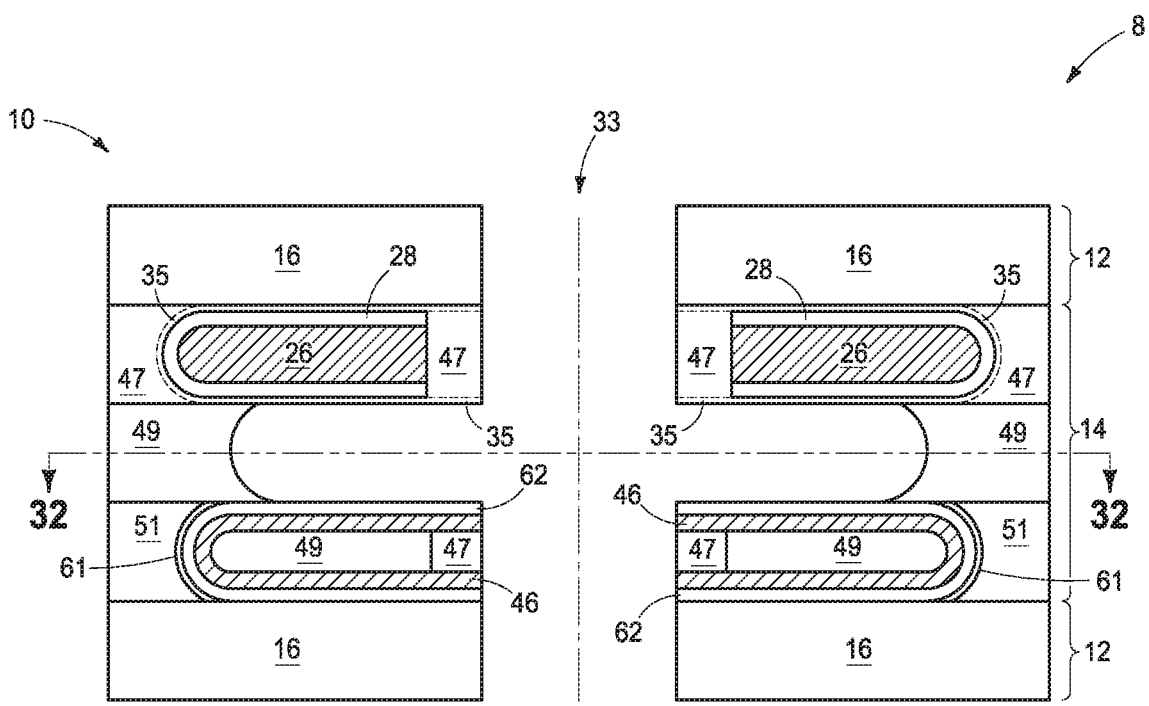
FIG. 33 is a sectional view taken through line 33-33 in FIG. 32, and is at the same larger scale as FIG. 12.

Referring to FIGS. 32 and 33, example silicon-dioxide-insulator material 49 has been subjected to a suitable selective etch (e.g., using dilute HF) to widen openings 33 within material 47 as-shown. Such exposes about 30 Angstroms of nitride liner 35 above and approximately 35 Angstroms of silicon liner 62 below.

Figure 34:
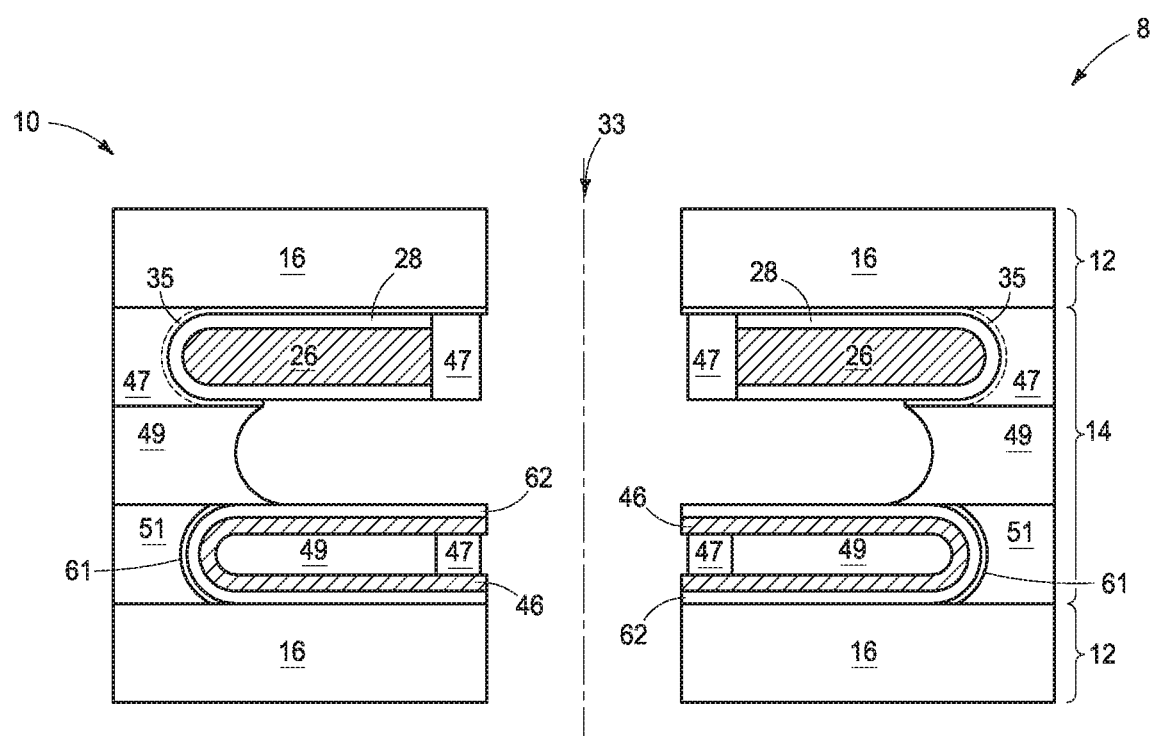
FIG. 34 is a sectional view of the FIG. 33 substrate at a processing step subsequent to that shown by FIG. 33, and is at the same larger scale as FIG. 12.

Referring to FIG. 34, example silicon-nitride-insulator material 47 has been subjected to a suitable etch (e.g., using hot phosphoric acid) to remove the depicted approximate 30 Angstroms of silicon nitride to expose gate insulator 28.

Figure 35:
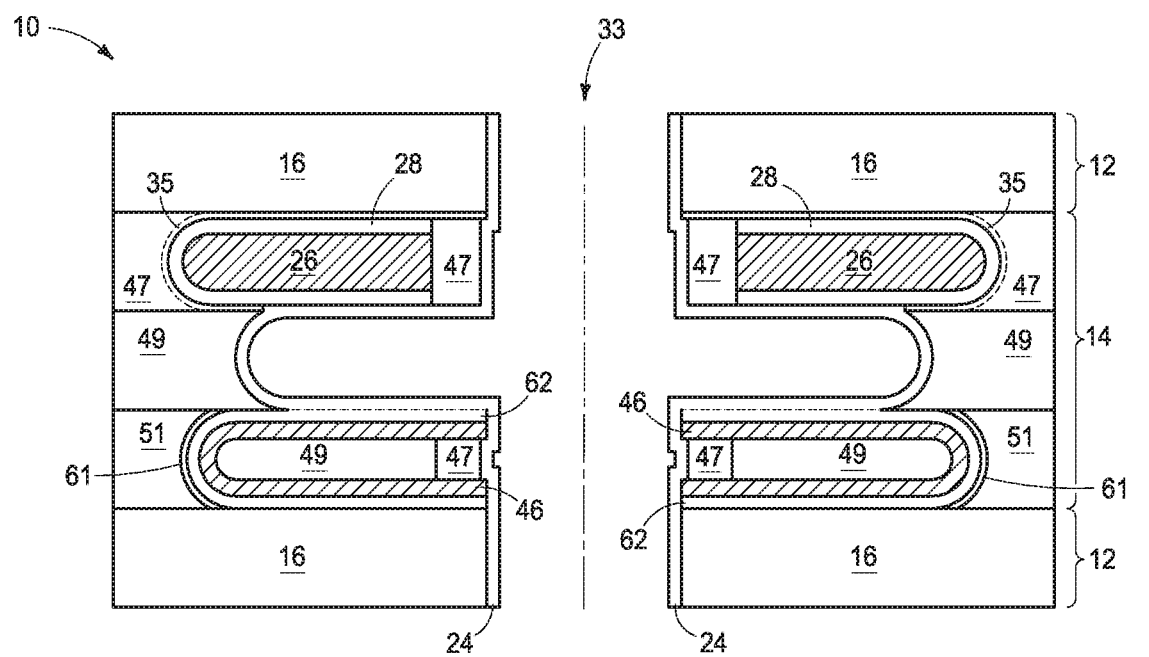
FIG. 35 is a sectional view of the FIG. 34 substrate at a processing step subsequent to that shown by FIG. 34, and is at the same larger scale as FIG. 12.

Referring to FIG. 35, suitable channel material 24 has been deposited (e.g., 50 Angstroms of suitably-doped polysilicon).

Figure 36:
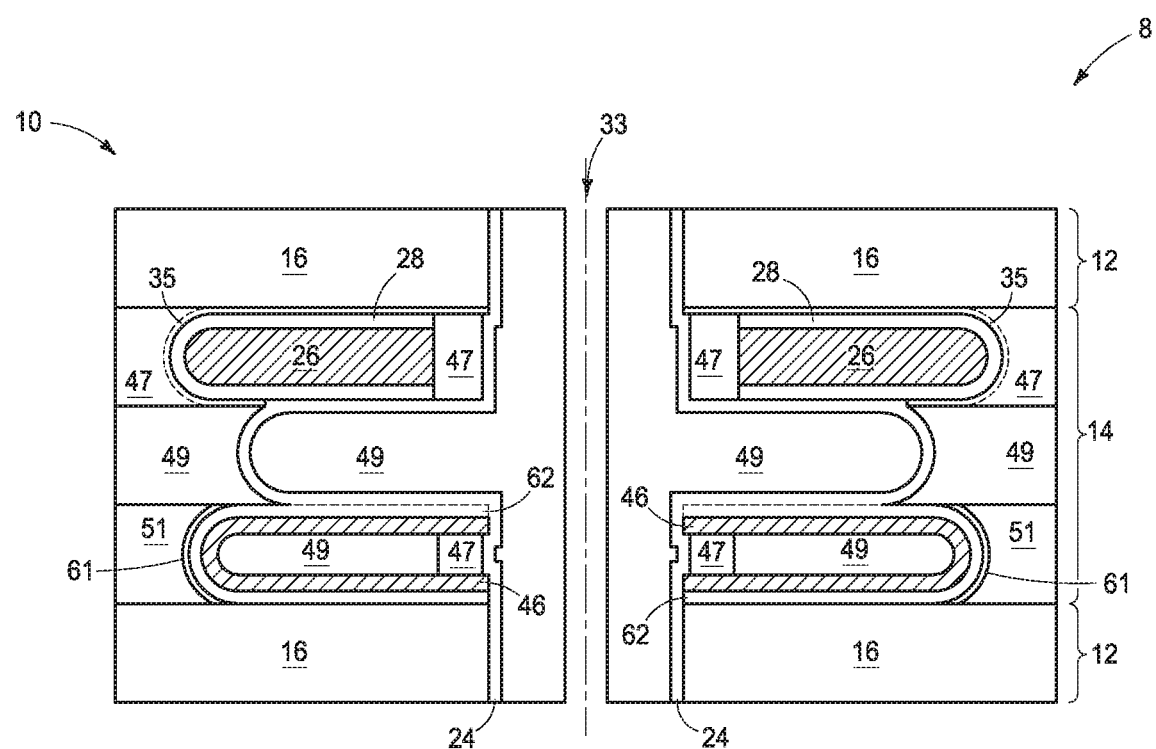
FIG. 36 is a sectional view of the FIG. 35 substrate at a processing step subsequent to that shown by FIG. 35, and is at the same larger scale as FIG. 12.
Figure 37:
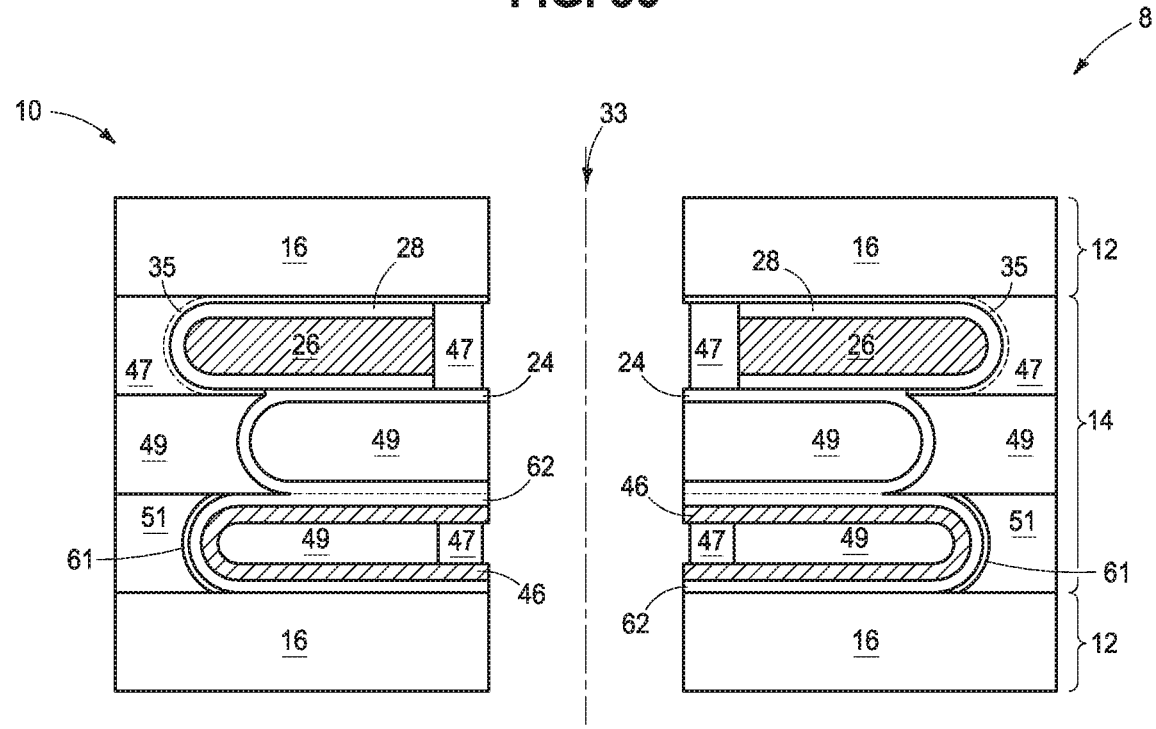
FIG. 37 is a sectional view of the FIG. 36 substrate at a processing step subsequent to that shown by FIG. 36, and is at the same larger scale as FIG. 12.

Referring to FIG. 36, example silicon-dioxide-insulator material 49 has been deposited to fill the depicted remaining volume of widened openings 33 with material 49, and ideally not sufficient to fill remaining volume of the narrowest portions of openings 33. FIG. 37 shows subsequent anisotropic etching of material 49 to remove such from being over sidewalls of openings 33.

Figure 38:
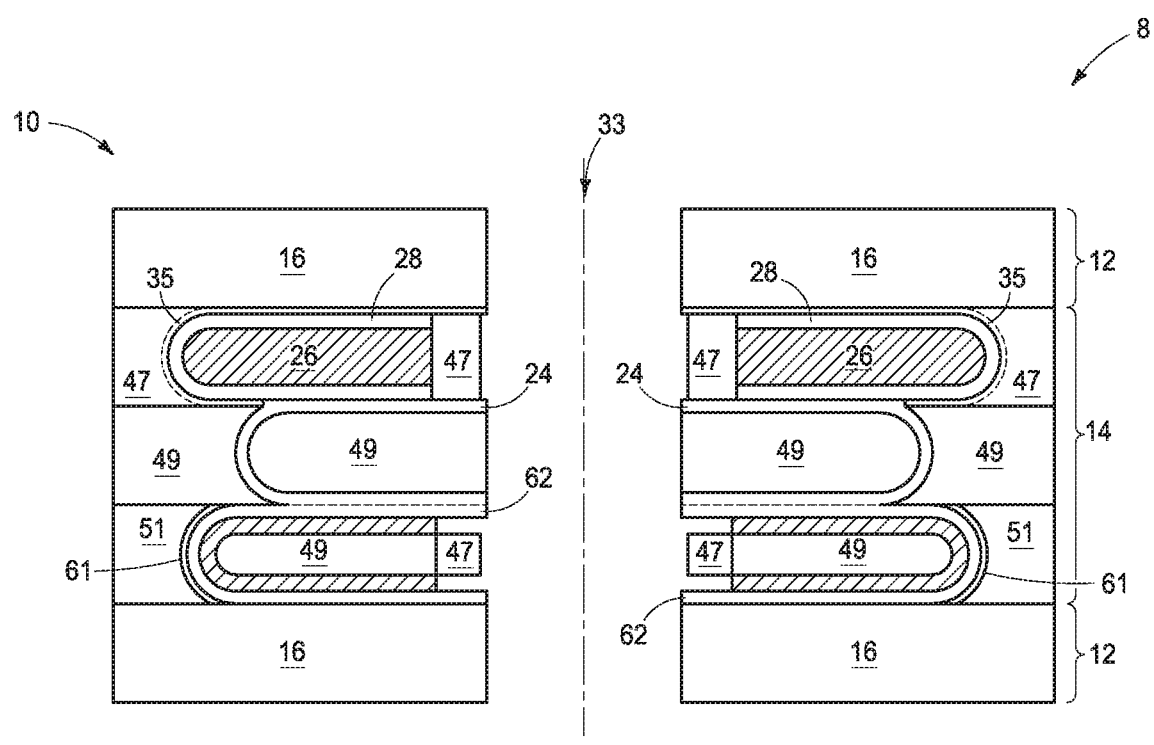
FIG. 38 is a sectional view of the FIG. 37 substrate at a processing step subsequent to that shown by FIG. 37, and is at the same larger scale as FIG. 12.

Referring to FIG. 38, example titanium nitride material 46 has been subjected to a suitable etch to recess it laterally/radially as shown (e.g., using sulfuric acid and hydrogen peroxide). Note that only a side surface of example silicon material 24 is exposed in an upper portion, whereas side and horizontal surfaces of silicon material 24 and silicon liner 62 are exposed in a lower portion.

Figure 39:
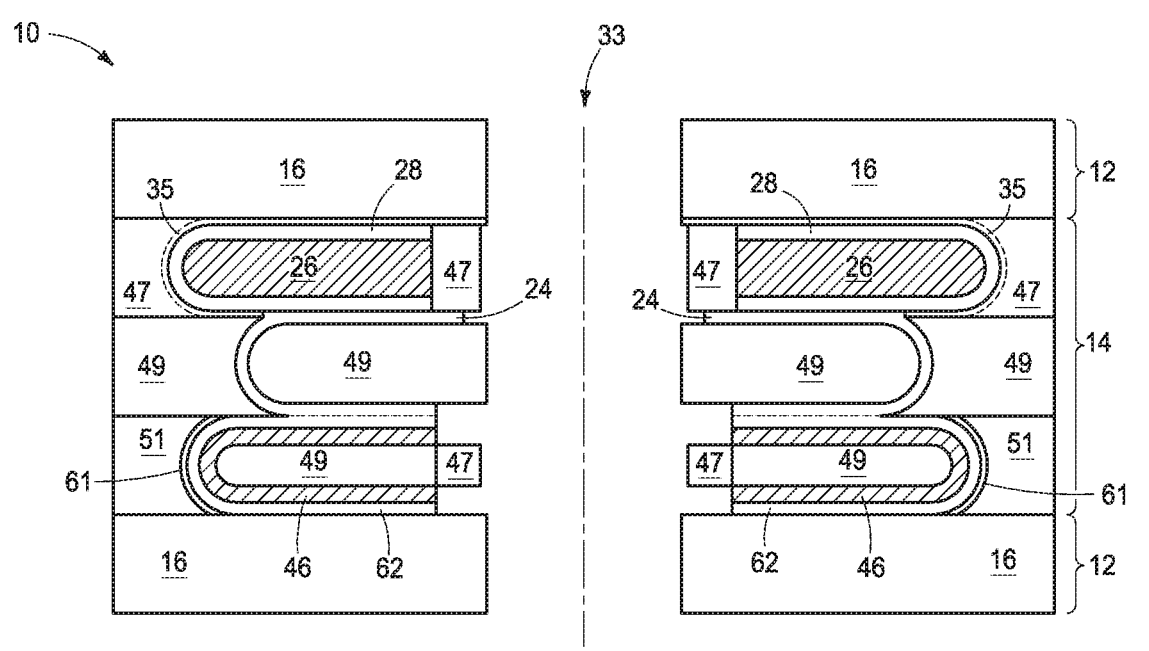
FIG. 39 is a sectional view of the FIG. 38 substrate at a processing step subsequent to that shown by FIG. 38, and is at the same larger scale as FIG. 12.

Referring to FIG. 39, silicon material 24 and silicon liner 62 have been subjected to a suitable wet or vapor etch (e.g., using TMAH). Such is ideally conducted to remove a greater amount of silicon material 24 and silicon liner 62 back in the lower portion as shown due to vertical and horizontal surface exposure of silicon, as compared to only vertical surface exposure of silicon material 24 in the upper portion.

Figure 40:
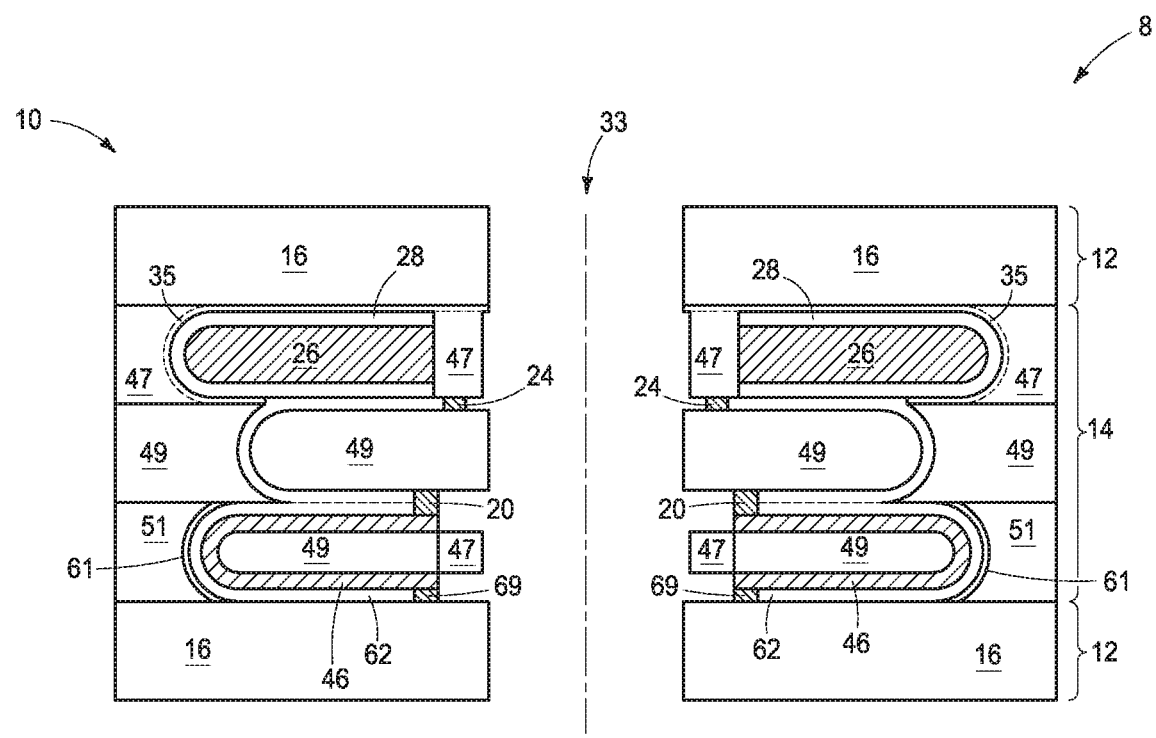
FIG. 40 is a sectional view of the FIG. 39 substrate at a processing step subsequent to that shown by FIG. 39, and is at the same larger scale as FIG. 12.

Referring to FIG. 40, example silicon material 24 and silicon liner 62 have has been subjected to a suitable ion implanting to form first source/drain regions 20 and second source/drain regions 22. Another doped region 69 may also be formed, and which may be non-functional and an artifact of manufacture.

Figure 41:
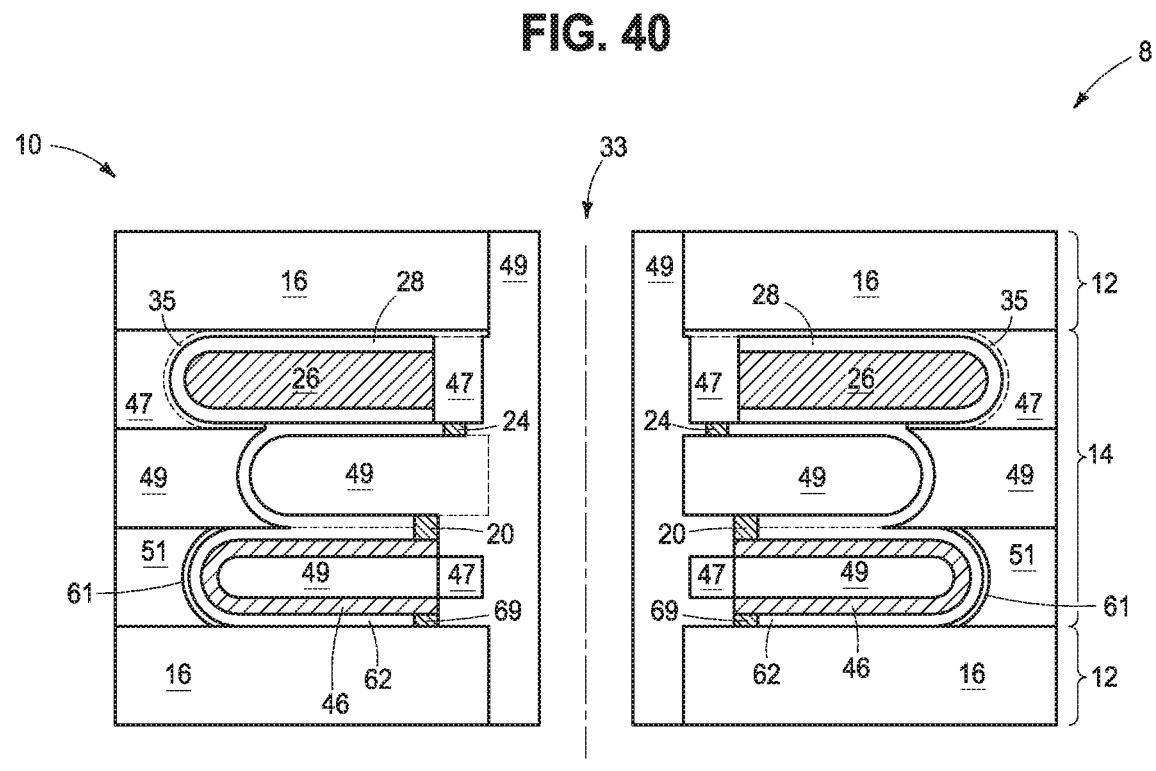
FIG. 41 is a sectional view of the FIG. 40 substrate at a processing step subsequent to that shown by FIG. 40, and is at the same larger scale as FIG. 12.
Figure 42:
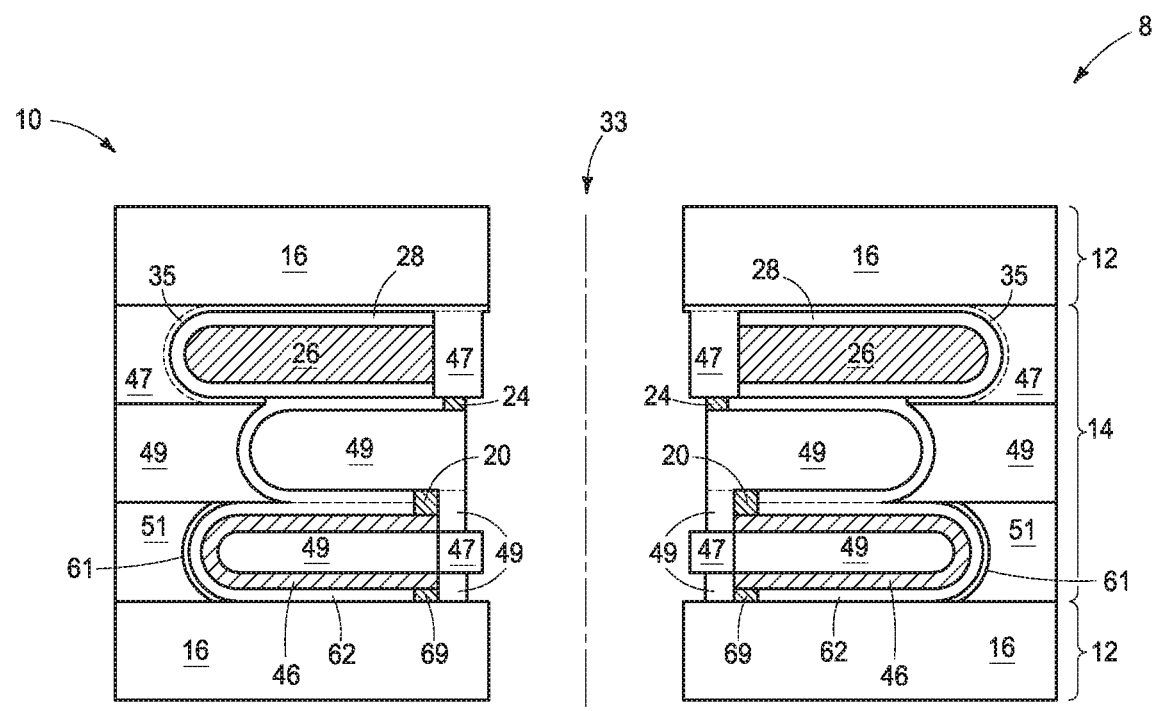
FIG. 42 is a sectional view of the FIG. 41 substrate at a processing step subsequent to that shown by FIG. 41, and is at the same larger scale as FIG. 12.

Referring to FIG. 41, example silicon-dioxide-insulator material 49 has again been deposited, and then anisotropically etched to remove it from being over sidewalls of opening 33 as shown in FIG. 42. An example minimum diameter of opening 33 in FIG. 42 is 900 Angstroms.

Figure 43:
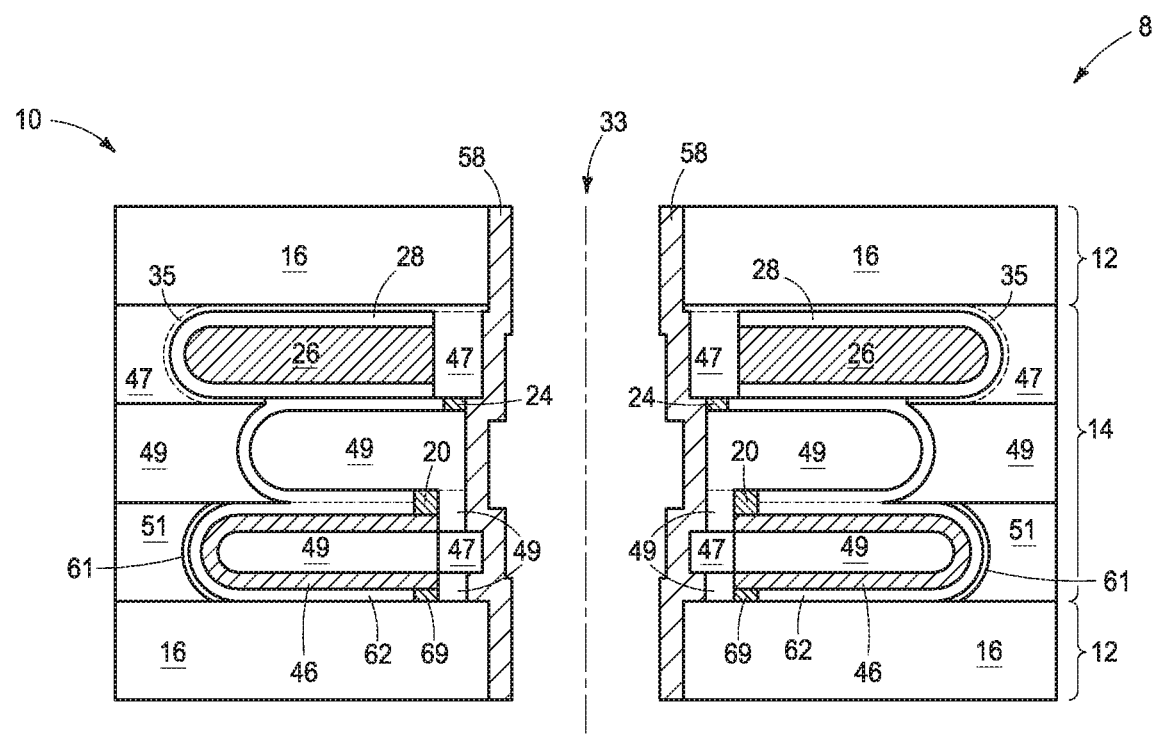
FIG. 43 is a sectional view of the FIG. 42 substrate at a processing step subsequent to that shown by FIG. 42, and is at the same larger scale as FIG. 12.
Figure 44:
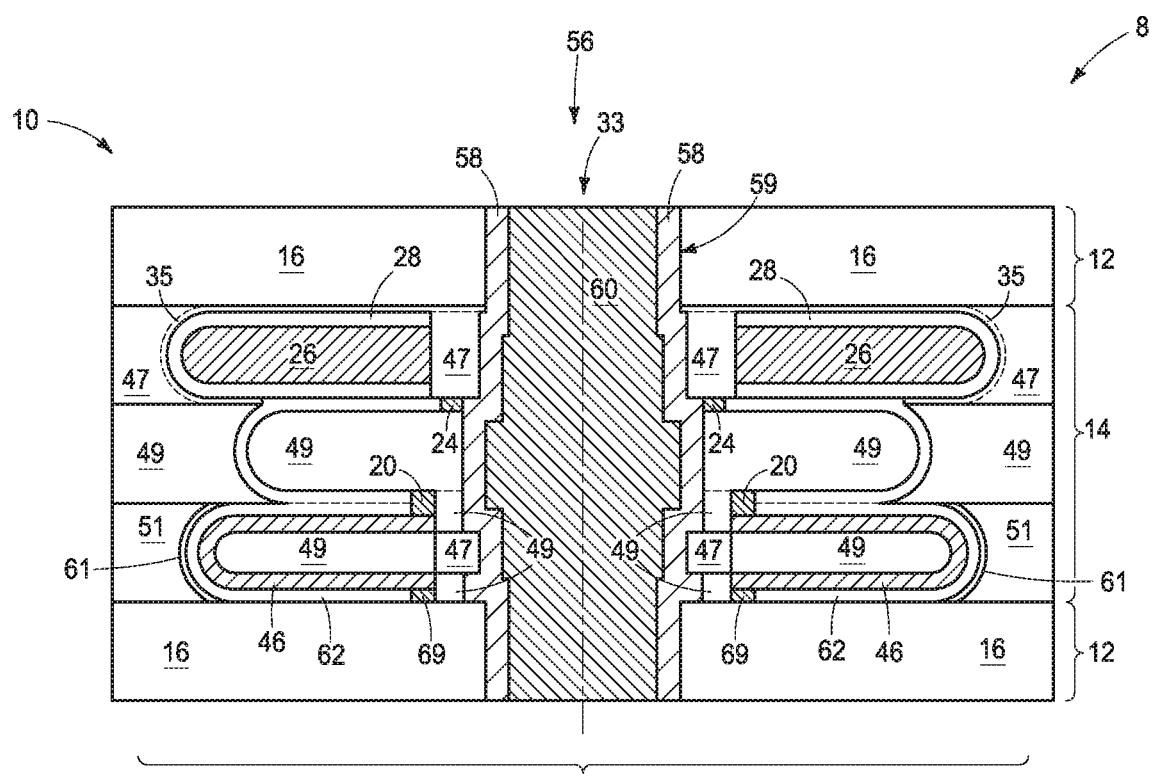
FIG. 44 is a sectional view of the FIG. 43 substrate at a processing step subsequent to that shown by FIG. 43, and is at the same larger scale as FIG. 12.

Referring to FIGS. 43 and 44, conductively-doped semiconductor material 58 has been formed, followed by forming of conductive core metal material 60, thus essentially completing formation of sense-line structures 56.

Figure 45:
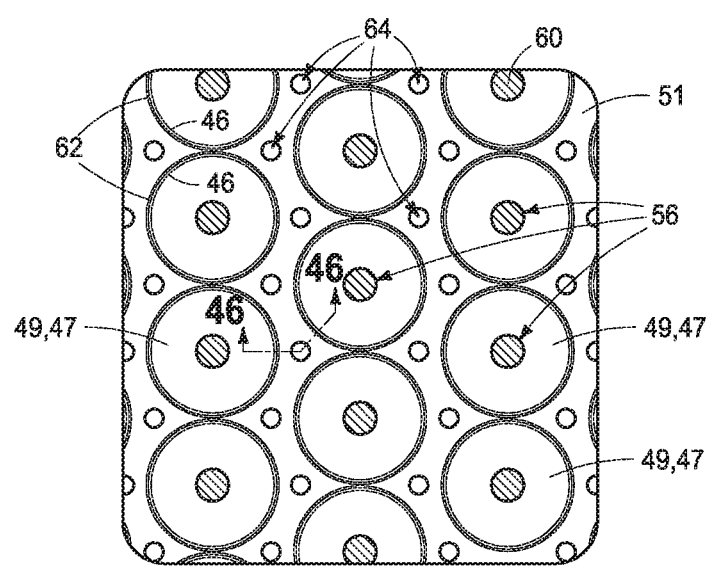
FIG. 45 is a sectional view of the FIG. 44 substrate at a processing step subsequent to that shown by FIG. 44, is taken through line 45-45 in FIG. 46, and is at the same scale as FIG. 11.
Figure 46:
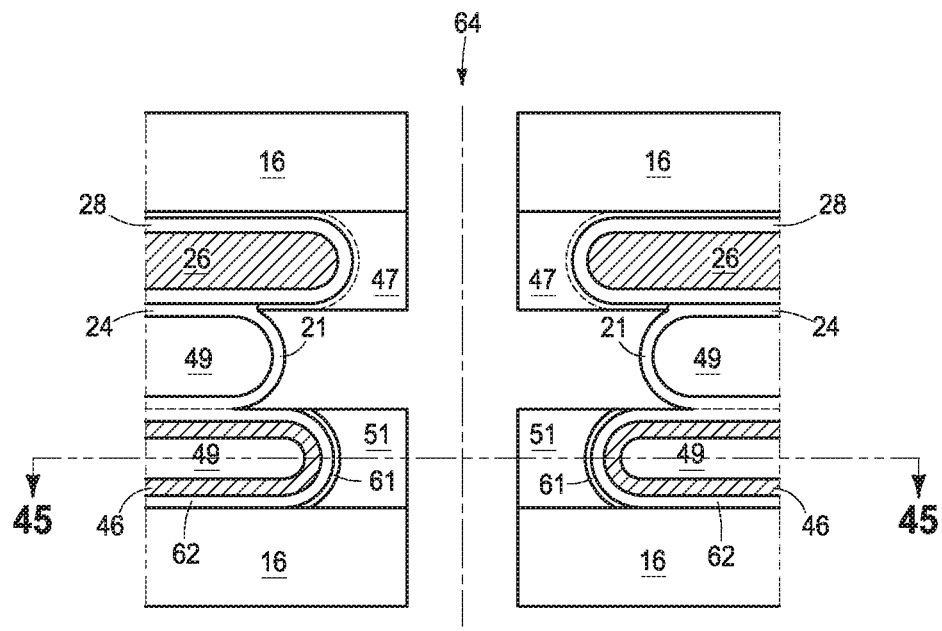
FIG. 46 is a sectional view taken through line 46-46 in FIG. 45, and is at the same larger scale as FIG. 12.
Figure 47:
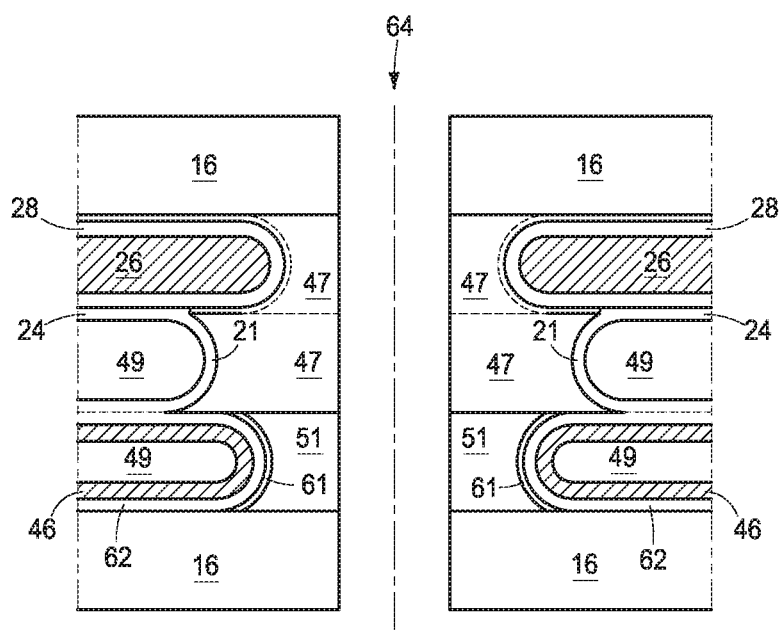
FIG. 47 is a sectional view of the FIG. 46 substrate at a processing step subsequent to that shown by FIG. 46, and is at the same larger scale as FIG. 12.

Referring to FIGS. 45 and 46, capacitor openings 64 have been formed as shown, and which will be used for ultimate formation of capacitor-electrode structures 52 (not shown in FIGS. 45 and 46 as not-yet-formed). An example minimum diameter of opening 64 is 900 Angstroms. Silicon-dioxide-insulator material 49 (not shown) exposed to opening 64 in the middle sub-tier of memory cell tier 14 has been removed by selective etching (e.g., using HF). In FIG. 47, such removed silicon dioxide has been replaced with silicon nitride 47 (e.g., by deposition sufficient to fill such recessed volume, followed by anisotropic etch thereof to remove such from within capacitor opening 64).

Figure 48:
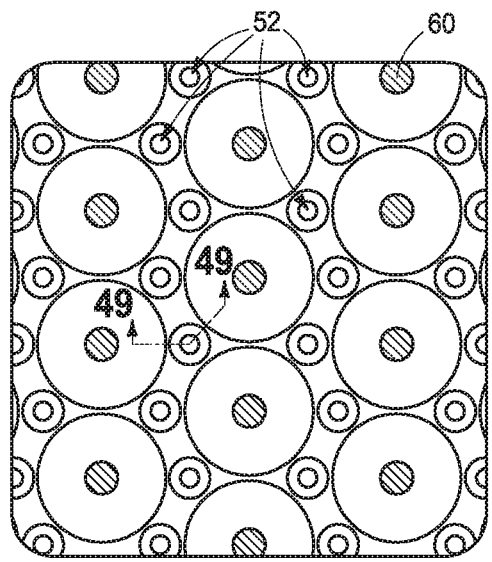
FIG. 48 is a sectional view of the FIG. 47 substrate at a processing step subsequent to that shown by FIG. 47, is taken through line 48-48 in FIG. 49, and is at the same scale as FIG. 11.
Figure 49:
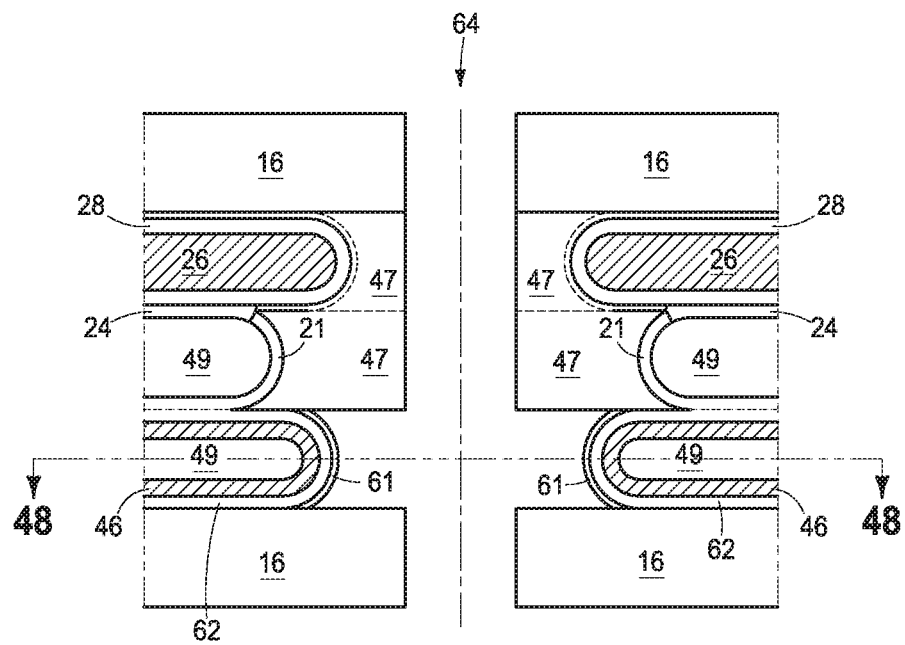
FIG. 49 is a sectional view taken through line 49-49 in FIG. 48.

Referring to FIGS. 48 and 49, example amorphous silicon material 51 (not shown) has been etched selectively relative to other exposed material to stop on native oxide layers 61 (e.g., using TMAH).

Figure 50:
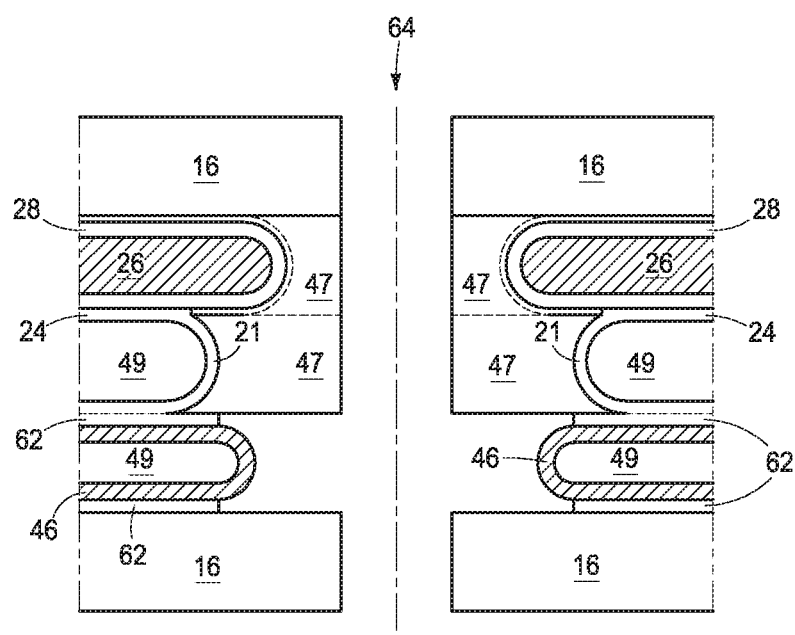
FIG. 50 is a sectional view of the FIG. 49 substrate at a processing step subsequent to that shown by FIG. 49, and is at the same larger scale as FIG. 12.

Referring to FIG. 50, native oxide 61 (not shown) has been etched away (e.g., using HF) to expose example titanium nitride material 46. Some material of silicon liner 62 is also shown as having been etched.

Figure 51:
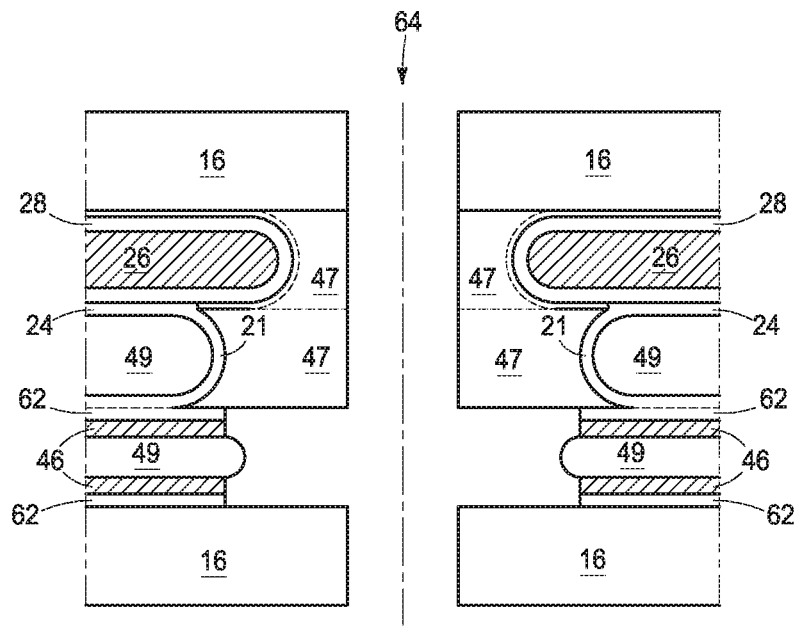
FIG. 51 is a sectional view of the FIG. 50 substrate at a processing step subsequent to that shown by FIG. 50, and is at the same larger scale as FIG. 12.
Figure 52:
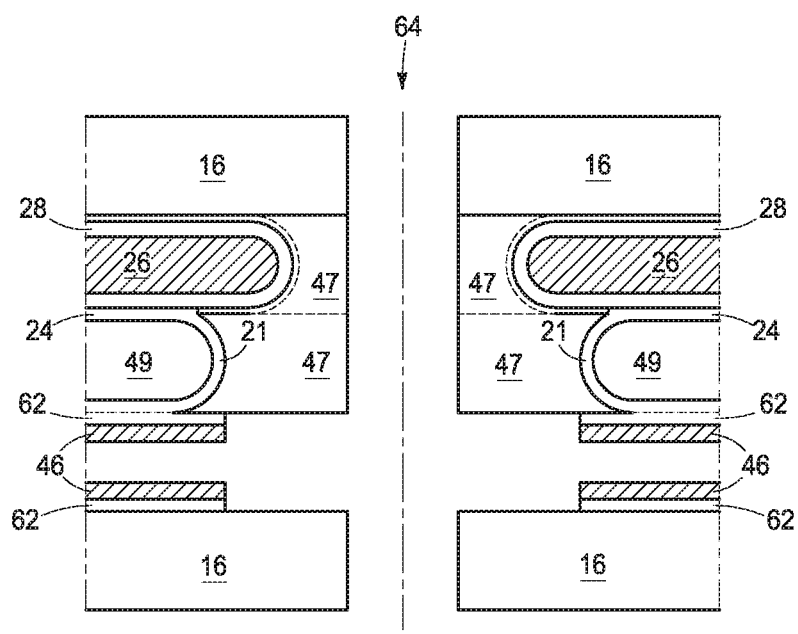
FIG. 52 is a sectional view of the FIG. 51 substrate at a processing step subsequent to that shown by FIG. 51, and is at the same larger scale as FIG. 12.

Referring to FIG. 51, example titanium nitride material 46 has been wet etched (e.g., using sulfuric acid and hydrogen peroxide) sufficiently to expose example silicon-dioxide-insulator material 49 there-between. FIG. 52 shows subsequent removal of such example silicon-dioxide-insulator material 49 from between titanium nitride material 46.

Figure 53:
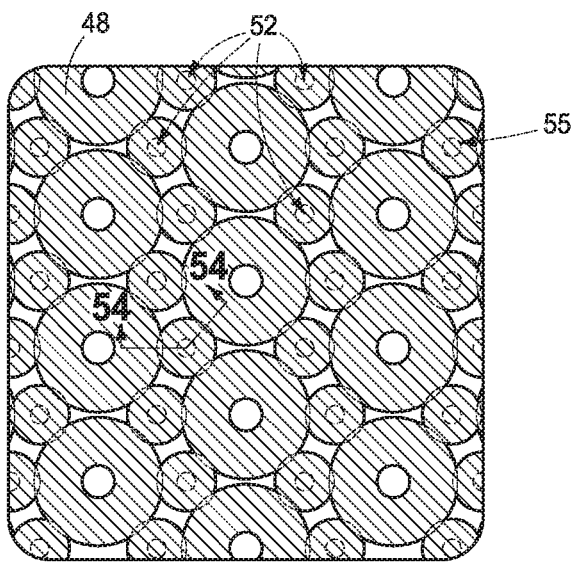
FIG. 53 is a sectional view of the FIG. 52 substrate at a processing step subsequent to that shown by is taken through line 53-53 in FIG. 54, and is at the same scale as FIG. 11.
Figure 54:
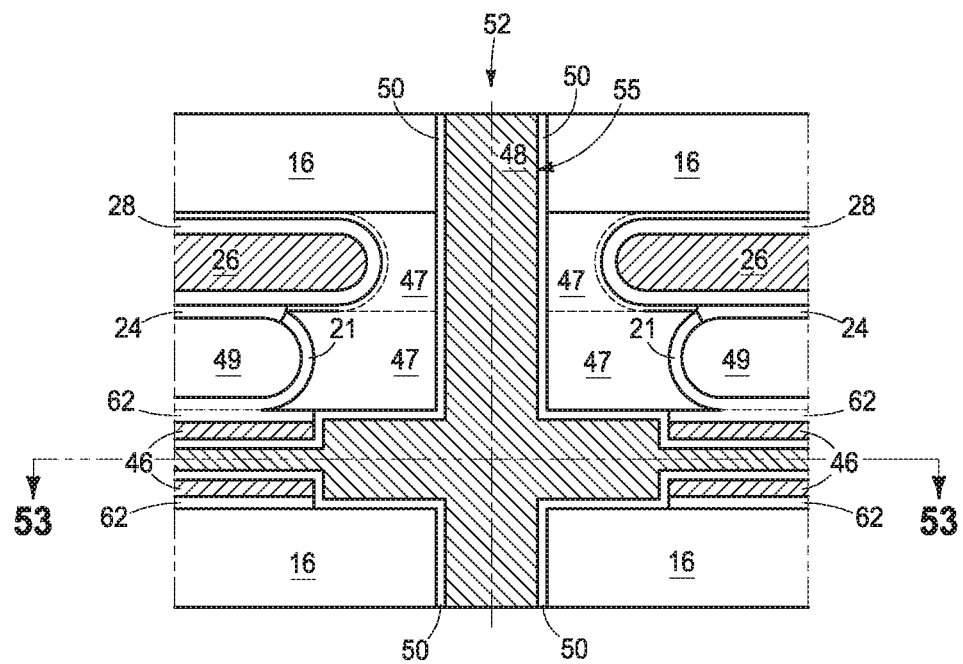
FIG. 54 is a sectional view taken through line 54-54 in FIG. 53, and is at the same larger scale as FIG. 12.

Referring to FIGS. 53 and 54, capacitor insulator 50 and second capacitor electrode material 48 have been deposited as shown.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extending elevationally" refer to a direction that is angled away by at least 45° from exactly horizontal. Further, "extend(ing) elevationally" and "elevationally-extending" with respect to a field effect transistor are with reference to orientation of the transistor's channel length along which current flows in operation between the source/drain regions. For bipolar junction transistors, "extend(ing) elevationally" and "elevationally-extending" are with reference to orientation of the base length along which current flows in operation between the emitter and collector.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be devotionally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region (s), or structure(s) result(s) in no physical touching contact of the stated materials, regions, or structures relative one another.

Herein, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

In this document, a selective etch or removal is an etch or removal where one material is removed relative to another stated material or materials at a rate of at least 2.0:1. Further, selectively growing or selectively forming is growing or forming one material relative to another stated material or materials at a rate of at least 2.0:1 for at least the first 100 Angstroms of growing or forming.

Further, a "self-aligned manner" means a technique whereby at least a lateral surface of a structure is defined by deposition of material against a sidewall of a previously-patterned structure.

CONCLUSION

In some embodiments, a memory array comprises vertically-alternating tiers of insulative material and memory cells. The memory cells individually comprise a transistor and a capacitor. One of (a) a channel region of the transistor, or (b) a pair of electrodes of the capacitor, is directly above the other of (a) and (b).

In some embodiments, a memory array comprises vertically-alternating tiers of insulative material and memory cells. The memory cells individually comprise a transistor comprising first and second source/drain regions having a channel region there-between and a gate operatively proximate the channel region. At least a portion of the channel region is horizontally-oriented for horizontal current flow in the portion between the first and second source/drain regions. The memory cells individually comprise a capacitor comprising first and second electrodes having a capacitor insulator there-between. The first electrode is electrically coupled to the first source/drain region. The second capacitor electrodes of multiple of the capacitors in the array are electrically coupled with one another. One of (a) the channel region of the transistor, or (b) the first and second electrodes of the capacitor, is directly above the other of (a) and (b). A sense-line structure extends elevationally through the vertically-alternating tiers. Individual of the second source/drain regions of individual of the transistors that are in different memory cell tiers are electrically coupled to the elevationally-extending sense-line structure.

In some embodiments, a memory array comprises vertically-alternating tiers of insulative material and memory cells. The memory cells individually comprise a transistor comprising first and second source/drain regions having a channel region there-between and a gate operatively proximate the channel region. At least a portion of the channel region is horizontally-oriented for horizontal current flow in the portion between the first and second source/drain regions. The memory cells individually comprise a capacitor comprising first and second electrodes having a capacitor insulator there-between. The first electrode is electrically coupled to the first source/drain region. One of (a) the channel region of the transistor, or (b) the first and second electrodes of the capacitor, is directly above the other of (a) and (b). A capacitor-electrode structure extends elevationally through the vertically-alternating tiers. Individual of the second electrodes of individual of the capacitors that are in different memory cell tiers are electrically coupled to the elevationally-extending capacitor-electrode structure. A sense line is electrically coupled to multiple of the second source/drain regions of individual of the transistors that are in different memory cell tiers.

In some embodiments, a memory array comprises vertically-alternating tiers of insulative material and memory cells. The memory cells individually comprise a transistor comprising first and second source/drain regions having a channel region there-between and a gate operatively proximate the channel region. At least a portion of the channel region is horizontally-oriented for horizontal current flow in the portion between the first and second source/drain regions. The individual memory cells comprise a capacitor comprising first and second electrodes having a capacitor insulator there-between. The first electrode is electrically coupled to the first source/drain region. One of (a) the channel region of the transistor, or (b) the first and second electrodes of the capacitor, is directly above the other of (a) and (h). A sense-line structure extends elevationally through the vertically-alternating tiers. Individual of the second source/drain regions of individual of the transistors that are in different memory cell tiers are electrically coupled to the elevationally-extending sense-line structure. A capacitor-electrode structure extends elevationally through the vertically-alternating tiers. Individual of the second electrodes of individual of the capacitors that are in different memory cell tiers are electrically coupled to the elevationally-extending capacitor-electrode structure.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory array comprising vertically-alternating tiers of insulative material and memory cells, the memory cells individually comprising a transistor and a capacitor, one of (a) a channel region of the transistor, or (b) a pair of electrodes of the capacitor, being directly above the other of (a) and (b); and
 a capacitor-electrode structure extending elevationally through the vertically-alternating tiers, the capacitor-electrode structure electrically coupling together one electrode of individual of the pairs of electrodes that are in different memory cell tiers.

2. The array of claim 1 wherein the channel region is directly above the pair of electrodes.

3. The array of claim 1 wherein the pair of electrodes is directly above the channel region.

4. The array of claim 1 wherein the transistor comprises first and second source/drain regions neither of which is directly above the other.

5. The array of claim 1 wherein the transistor comprises first and second source/drain regions one of which is above the other.

6. The array of claim 5 wherein neither of the first and second source/drain regions is directly above the other.

7. The array of claim 1 wherein all of the channel region is horizontally-oriented for horizontal current flow therethrough.

8. A memory array comprising vertically-alternating tiers of insulative material and memory cells, the memory cells individually comprising:
 a transistor and a capacitor, one of (a) a channel region of the transistor, or (b) a pair of electrodes of the capacitor, being directly above the other of (a) and (b); and
 the transistor comprising first and second source/drain regions having the channel region there-between, the first and second source/drain regions and the channel region collectively comprising opposing C-like shapes that face one another in a straight-line vertical cross-section.

9. A memory array comprising vertically-alternating tiers of insulative material and memory cells, the memory cells individually comprising:
 a transistor and a capacitor, one of (a) a channel region of the transistor, or (b) a pair of electrodes of the capacitor, being directly above the other of (a) and (b); and
 at least one electrode of the pair comprising opposing C-like shapes that face one another in a straight-line vertical cross-section.

10. The array of claim 1 wherein the channel region comprises an annulus in a straight-line horizontal cross-section.

11. The array of claim 1 wherein at least one of the pair of electrodes comprises an annulus in a straight-line horizontal cross-section.

12. The array of claim 1 wherein the transistor comprises a gate, the gate comprising an annulus in a straight-line horizontal cross-section.

13. A memory array comprising vertically-alternating tiers of insulative material and memory cells, the memory cells individually comprising:
 a transistor and a capacitor, one of (a) a channel region of the transistor, or (b) a pair of electrodes of the capacitor, being directly above the other of (a) and (b);
 the transistor comprising a gate, the gate comprising an annulus in a straight-line horizontal cross-section; and
 a plurality of the gates in individual of the tiers of memory cells being directly electrically coupled to one another along a conductive line, the annuli of immediately-laterally-adjacent of the gates overlapping one another in the line.

14. A memory array, comprising:
vertically-alternating tiers of insulative material and memory cells, the memory cells individually comprising:
 a transistor comprising first and second source/drain regions having a channel region there-between and a gate operatively proximate the channel region, at least a portion of the channel region being horizontally-oriented for horizontal current flow in the portion between the first and second source/drain regions;
 a capacitor comprising first and second electrodes having a capacitor insulator there-between, the first electrode being electrically coupled to the first source/drain region, the second capacitor electrodes of multiple of the capacitors in the array being electrically coupled with one another; and one of (a) the channel region of the transistor, or (b) the first and second electrodes of the capacitor, being directly above the other of (a) and (b); and a sense-line structure extending elevationally through the vertically-alternating tiers, individual of the second source/drain regions of individual of the transistors that are in different memory cell tiers being electrically coupled to the elevationally-extending sense-line structure.

15. The array of claim 14 wherein the sense-line structure is directly electrically coupled to a horizontal longitudinally-elongated sense line that is above or below the vertically-alternating tiers.

16. The array of claim 14 wherein the sense-line structure comprises a pillar.

17. A memory array, comprising:

vertically-alternating tiers of insulative material and memory cells, the memory cells individually comprising:

a transistor comprising first and second source/drain regions having a channel region there-between and a gate operatively proximate the channel region, at least a portion of the channel region being horizontally-oriented for horizontal current flow in the portion between the first and second source/drain regions;

a capacitor comprising first and second electrodes having a capacitor insulator there-between, the first electrode being electrically coupled to the first source/drain region; and one of (a) the channel region of the transistor, or (b) the first and second electrodes of the capacitor, being directly above the other of (a) and (b);

a capacitor-electrode structure extending elevationally through the vertically-alternating tiers, individual of the second electrodes of individual of the capacitors that are in different memory cell tiers being electrically coupled to the elevationally-extending capacitor-electrode structure; and a sense line electrically coupled to multiple of the second source/drain regions of individual of the transistors that are in different memory cell tiers.

18. The array of claim 17 wherein the sense-line structure comprises a pillar.

19. The array of claim 17 comprising at least one more capacitor-electrode structure extending elevationally through the vertically-alternating tiers, the individual second electrodes of the individual capacitors that are in different memory cell tiers being electrically coupled to the at least one more elevationally-extending capacitor-electrode structure.

20. The array of claim 19 comprising more than one more capacitor-electrode structure extending elevationally through the vertically-alternating tiers.

21. The array of claim 20 wherein the capacitor-electrode structures are circumferentially spaced about the first electrode.

22. The array of claim 21 wherein the capacitor-electrode structures total six in number.

23. The array of claim 17 wherein the capacitor-electrode structure is directly electrically coupled to a horizontally-elongated capacitor-electrode construction that is above or below the vertically-alternating tiers.

24. A memory array, comprising:

vertically-alternating tiers of insulative material and memory cells, the memory cells individually comprising:

a transistor comprising first and second source/drain regions having a channel region there-between and a gate operatively proximate the channel region, at least a portion of the channel region being horizontally-oriented for horizontal current flow in the portion between the first and second source/drain regions;

a capacitor comprising first and second electrodes having a capacitor insulator there-between, the first electrode being electrically coupled to the first source/drain region; and one of (a) the channel region of the transistor, or (b) the first and second electrodes of the capacitor, being directly above the other of (a) and (b);

a sense-line structure extending elevationally through the vertically-alternating tiers, individual of the second source/drain regions of individual of the transistors that are in different memory cell tiers being electrically coupled to the elevationally-extending sense-line structure; and a capacitor-electrode structure extending elevationally through the vertically-alternating tiers, individual of the second electrodes of individual of the capacitors that are in different memory cell tiers being electrically coupled to the elevationally-extending capacitor-electrode structure.

25. The array of claim 24 comprising at least one more capacitor-electrode structure extending elevationally through the vertically-alternating tiers, the individual second electrodes of the individual capacitors being electrically coupled to the at least one more elevationally-extending capacitor-electrode structure.

26. The array of claim 25 comprising more than one more capacitor-electrode structure extending elevationally through the vertically-alternating tiers, the capacitor-electrode structures being circumferentially spaced about the first electrode.

27. The array of claim 24 wherein the gate comprises an annulus in a straight-line horizontal cross-section, a plurality of the gates in individual of the tiers of memory cells being directly electrically coupled to one another along a conductive line, the annuli of immediately-laterally-adjacent of the gates overlapping one another in the line.

* * * * *

UNITED STATES PATENT AND TRADEMARK OFFICE
CERTIFICATE OF CORRECTION

PATENT NO.         : 10,825,815 B2
APPLICATION NO.    : 15/973707
DATED              : November 3, 2020
INVENTOR(S)        : Sanh D. Tang and Martin C. Roberts It is certified that error appears in the above-identified patent and that said Letters Patent is hereby corrected as shown below:

On the Title Page

Item (57) Abstract Line 4 – Replace "a channel region of e transistor, or (b) a pair of electrodes of" with --a channel region of the transistor, or (b) a pair of electrodes of--

Signed and Sealed this
Twelfth Day of January, 2021

Andrei Iancu
*Director of the United States Patent and Trademark Office*